(12) United States Patent
Sunkara et al.

(10) Patent No.: US 9,409,141 B2
(45) Date of Patent: Aug. 9, 2016

(54) METHODS FOR SYNTHESIZING METAL OXIDE NANOWIRES

(75) Inventors: Mahendra Kumar Sunkara, Louisville, KY (US); Vivekanand Kumar, Louisville, KY (US); Jeong H. Kim, Louisville, KY (US); Ezra Lee Clark, Louisville, KY (US)

(73) Assignee: University of Louisville Research Foundation, Louisville, KY (US)

( * ) Notice: Subject to any disclaimer, the term of this patent is extended or adjusted under 35 U.S.C. 154(b) by 916 days.

(21) Appl. No.: 13/183,191

(22) Filed: Jul. 14, 2011

(65) Prior Publication Data

US 2013/0017145 A1 Jan. 17, 2013

(51) Int. Cl.

| | |
|---|---|
| *C01G 23/047* | (2006.01) |
| *B01J 19/08* | (2006.01) |
| *B82Y 30/00* | (2011.01) |
| *B82Y 40/00* | (2011.01) |
| *C01B 33/32* | (2006.01) |
| *C30B 25/10* | (2006.01) |
| *C30B 29/16* | (2006.01) |
| *C30B 29/60* | (2006.01) |

(Continued)

(52) U.S. Cl.
CPC .............. *B01J 19/088* (2013.01); *B82Y 30/00* (2013.01); *B82Y 40/00* (2013.01); *C01B 33/32* (2013.01); *C01G 1/02* (2013.01); *C01G 23/005* (2013.01); *C01G 23/047* (2013.01); *C01G 41/02* (2013.01); *C01G 45/02* (2013.01); *C01G 51/04* (2013.01); *C30B 25/105* (2013.01); *C30B 29/16* (2013.01); *C30B 29/60* (2013.01); *B01J 2219/0879* (2013.01); *C01G 23/04* (2013.01); *C01G 23/043* (2013.01); *C01P 2002/72* (2013.01); *C01P 2002/77* (2013.01); *C01P 2004/03* (2013.01); *C01P 2004/04* (2013.01); *C01P 2004/13* (2013.01); *C01P 2004/16* (2013.01)

(58) Field of Classification Search
CPC .... C01G 23/04; C01G 23/043; C01G 23/047; C01G 51/04; C01G 45/02
USPC ...................... 423/598, 610, 609, 594.19, 605
See application file for complete search history.

(56) References Cited

U.S. PATENT DOCUMENTS

| | | | |
|---|---|---|---|
| 7,572,300 B2 * | 8/2009 | Cohen et al. ..................... 850/58 |
| 2009/0162272 A1 * | 6/2009 | Park et al. ................ 423/594.17 |

OTHER PUBLICATIONS

Wu et al, Composite of TiO2 nanowires and Nafion as humidity sensor material, 2006, Sensors and Actuators, 115, 198-204.*

(Continued)

*Primary Examiner* — Matthew E Hoban
*Assistant Examiner* — James Fiorito
(74) *Attorney, Agent, or Firm* — Eric Castlen; Joan L. Simunic

(57) ABSTRACT

A method of synthesizing a metal oxide nanowire includes the steps of: combining an amount of a transition metal or a transition metal oxide with an amount of an alkali metal compound to produce a mixture; activating a plasma discharge reactor to create a plasma discharge; exposing the mixture to the plasma discharge for a first predetermined time period such that transition metal oxide nanowires are formed; contacting the transition metal oxide nanowires with an acid solution such that an alkali metal ion is exchanged for a hydrogen ion on each of the transition metal oxide nanowires; and exposing the transition metal oxide nanowires to the plasma discharge for a second predetermined time period to thermally anneal the transition metal oxide nanowires. Transition metal oxide nanowires produced using the synthesis methods described herein are also provided.

15 Claims, 16 Drawing Sheets

(51) Int. Cl.

| | |
|---|---|
| *C01G 23/00* | (2006.01) |
| *C01G 41/02* | (2006.01) |
| *C01G 45/02* | (2006.01) |
| *C01G 51/04* | (2006.01) |
| *C01G 1/02* | (2006.01) |
| C01G 23/04 | (2006.01) |

(56) References Cited

OTHER PUBLICATIONS

Mozetic et al., "Method for the rapid synthesis of large quantities of Metal Oxide Nanowires at Low Temperatures," Adv. Mater., 2005, vol. 17, pp. 213842.
Park et al., "Simple and fast annealing synthesis of titanium dioxide nanostructures and morphology transformation during annealing processes," Nanotechnology, 2009, vo. 20(10), pp. 105608 (8 pp.).
Peng et al., "Large-Scale Synthesis and Characterization of TiO2-Based Nanostructures on Ti Substrates," Adv. Funct. Mater., 2006, vol. 16, pp. 1355-1362.
Salmaoui et al., "Characterization of h-WO3 nanorods synthesized by hydrothermal process," Polyhedron, 2010, vol. 29, pp. 1771-1775.
Santato et al., "Crystallographically oriented mesoporous WO3 Films: Synthesis, Characterization, and Applications," Journal of the American Chemical Society, 2001, vol. 123, pp. 10639-10649.
Sato et al., "Surface Tensions of Molten Alkali-Metal Halides," J. Phys. Chem., 1989, vol. 94, pp. 1991-1996.
Senthil et al., "Growth and characterization of stoichiometric tungsten oxide nanorods by thermal evaporation and subsequent annealing," Nanotechnology, 2007, vol. 18, pp. 95604 (7 pp.).
Sharma et al., "Direct synthesis of gallium oxide tubes, nanowires, and nanopaintbrushes," J. Am. Chem. Soc., 2002, vol. 124 (41), pp. 12288-12293.
Shen et al., "Manganese oxide octahedral molecular sieves: Preparation, Characterization, and Applications," Science, 1993, vol. 260, pp. 511-515.
Sunkara et al., "Bulk synthesis of silicon nanowires using a low-temperature vapor-liquid-solid method," Appl. Phys. Lett., 2001, vol. 79, pp. 1546-1548.
Thangala et al., "Large-scale, hot-filament-assisted synthesis of tungsten oxide and related transition metal oxide nanowires," Small, 2007, vol. 3, 8 pp.
Tsai et al., "Structural Features of Nanotubes Synthesized from NaOH Treatment on TiO2 with Different Post-Treatments," Chem. Mater., 2005, vol. 18, pp. 367-373.
Yu et al., "Controlled growth and field-emission properties of cobalt oxide nanowalls," Advanced Material, 2005, vol. 17, pp. 1595-1599.
Yuan et al., "Moderate hydrothermal synthesis of potassium titanate nanowires," Appl. Phys. A: Mater. Sc. Process., 2004, vol. 78, pp. 1063-1066.
Yuchun et al., "Interfacial Interaction and Mechanical Properties of Nylon 6-Potassium Titanate Composites Prepared by In-situ Polymerization," J. Appl. Polym. Sc., 1997, vol. 64, pp. 2317-2322.
Wang et al., "Electrochemical capacitance study on Co3O4; nanowires for super capacitors application," Journal of Materials Science: Materials in Electronics, 2010, vol. 22, pp. 601-606.
Wang et al., "Large aspect ratio titanate nanowire prepared by monodispersed titania submicron sphere via simple wet-chemical reactions," J. Sol. St. Chem., 2007, vol. 180, pp. 1028-1037.
Wang et al., "Synthesis and characterization of large scale potassium titanate nanowires with good Li-intercalation performance," Chemical Physics Letters, 2005, vol. 406, pp. 95-100.
Wang et al.a, "Preparation of Smooth Single-Crystal Mn3O4 Nanowires," Advanced Materials, 2002, vol. 14, pp. 837-840.
Wu et al., "Composite of TiO2 nanowires and Nafion as humidity sensor material," Sensors and Actuators B: Chemical, 2006, vol. 115, pp. 198-.204.
Wu et al., "Growth of TiO2 nanorods by two-step thermal evaporation," J. Vac. Sc. Technol. B, 2005, vol. 23(5), pp. 2122-2126.

Wu et al., "Fabrication and photoluminescence characteristics of single crystalline In2O3 nanowires," Chemical Physics Letters, 2003, vol. 373, pp. 28-32.
Zhang et al., "Characterization and catalytic activity for the NO decomposition and reduction by CO of nanosized Co3O4," Journal of Alloys and Compounds, 2005, vol. 392, pp. 317-321.
Zhang et al., "Catalytic growth of Ga2O3 nanowires by physical evaporation and their photoluminescence properties," Chemical Physics, 2003, vol. 289, pp. 243-249.
Zhang et al., "Hydrothermal synthesis and photoluminescence of TiO2 nanowires," Chem. Phys. Lett., 2002, vol. 365, pp. 300-304.
Zhou et al., "Synthesis of large-scaled MoO2 nanowire arrays," Chemical Physics Letters, 2003, vol. 382, pp. 443-446.
Hernandez-Velez, M., "Nanowires and 1D arrays fabrication: An overview," Thin Sol. Films, 2006, vol. 495, pp. 51-63.
Adachi et al., "Highly efficient dye-sensitized solar cells with a titania thin-film electrode composed of a network structure of single-crystal-like TiO2 nanowires made by the oriented attachment mechanism," J. Am. Chem. Soc, 2004, vol. 126, pp. 14943-14949.
Armstrong et al., "TiO2(B) Nanowires as an improved anode material for lithium-ion batteries containing LiFePO4 or LiNi0.5Mn1.5O4 cathodes and a polymer electrolyte," Advanced Materials, 2006, vol. 18, pp. 2597-2600.
Baek et al., "Controlled Growth and Characterization of Tungsten Oxide Nanowires Using Thermal Evaporation of WO3 Powder," The Journal of Physical Chemistry C, 2007, vol. 111, pp. 1213-1218.
Bale C., "The K—Ti (Potassium—Titanium) System," Bulletin of Alloy Phase Diagrams, 1989, vol. 10, pp. 134-135.
Bao et al., "Study on the formation and growth of potassium titanate whiskers," J. Mater. Sc., 2002, vol. 37(14), pp. 3035-3043.
Brezesinski et al., "Templated nanocrystal-based porous TiO2 films for next-generation electrochemical capacitors," Journal of the American Chemical Society, 2009, vol. 131:5, pp. 1802-1809.
Cabanas et al., "A continuous and clean one-step synthesis of nanoparticulate CeZrO solid solutions in near-critical water," Chemical Communications, 2000, 901-2.
Chang et al., "Synthesis and characterization of Mn3O4 nanoparticles," Journal of Crystal Growth, 2004, vol. 264, pp. 232-236.
Chandraskaran et al., "Rationalization of nanowire synthesis using low-melting point metals," J. Phys. Chem. B, 2006, vol. 110(37), pp. 18351-18357.
Chen et al., "Bulk-quantity synthesis and self-catalytic VLS growth of SnO2 nanowires by lower-temperature evaporation," Chemical Physics Letters, 2003, vol. 369, pp. 16-20.
Cheung et al., "Long K-doped titania and titanate nanowires on Ti foil and FTO/quartz substrates for solar-cell applications," Adv. Funct. Mater., 2007, vol. 17, pp. 555-562.
Chung et al., "Rapid Synthesis of titania nanowires by microwave-assisted hydrothermal treatments," Industrial & Engineering Chemistry Research, 2008, vol. 47, pp. 2301-2307.
Cvelbar et al., "Spontaneous growth of superstructure α-Fe2O3 nanowire and nanobelt arrays in reactive oxygen plasma," Small, 2008, vol. 4(10), pp. 1610-1614.
Dai et al., "Bicrystalline zinc oxide nanowires," Chemical Physics Letters, 2003, vol. 375, pp. 96-101.
Daniel et al., "Infrared and raman study of WO3 tungsten trioxides and WO3, x H2O tungsten trioxide tydrates," Journal of Solid State Chemistry, 1987, vol. 67, pp. 235-247.
Drelich et al., "NOTE—Examination of Neumann's Equation-of-State for Interfacial Tensions," J. Colloid Interface Sc., 1994, vol. 167, pp. 217-220.
Du et al., "Potassium titanate nanowire: Structure, growth, and optical properties," Phys. Rev. B., 2003, vol. 67, pp. 035323-1-035323-7.
Fang et al., "Facile and large-scale synthesis of single-crystalline manganese oxyhydroxide/oxide nanostructures," Materials Research Bulletin, 2007, vol. 42, pp. 1761-1768.
Francioso et al., "TiO2 nanowires array fabrication and gas sensing properties," Sens. Actuators B Chem, 2008, vol. 130, pp. 70-76.
Gao et al., "A comparison study on Raman scattering properties of [alpha]- and [beta]-MnO2," Analytica Chimica Acta, 2009, vol. 648, pp. 235-239.

(56) References Cited

OTHER PUBLICATIONS

Gu et al., "Large-scale synthesis of single-crystal hexagonal tungsten trioxide nanowires and electrochemical lithium intercalation into the nanocrystals," Journal of Solid State Chemistry, 2007, vol. 180, pp. 98-105.

Gubbala et al., "Band-Edge Engineered Hybrid Structures for Dye-Sensitized Solar Cells Based on SnO2 Nanowires," Adv. Funct. Mater., 2008, vol. 18, pp. 2411-2418.

Ha et al, "Hydrothermal synthesis and characterization of self-assembled h-WO3 nanowires/nanorods using EDTA salts," Journal of Alloys and Compounds, 2009, vol. 475, pp. 446-451.

Hadjiev et al., "The Raman spectra of Co3O4," Journal of Physics C: Solid State Physics., 1988 vol. 21, pp. L199-L201.

He et al., "Rapid, low-temperature synthesis of single-crystalline Co3O4 nanorods on silicon substrates on a large scale," Nanotechnology, 2008, vol. 19, 155606, 4pp.

Hong et al., "Gas-phase synthesis of nitrogen-doped TiO2 nanorods by microwave plasma torch at atmospheric pressure," Phys. Plasmas, 2005, vol. 12, pp. 114501-1-114501-4.

Hoyer P, "Formation of a Titanium Dixoide Nanotube Array," Langmuir, 1996, vol. 12, pp. 1411-1413.

Hu et al., "A hierarchical nanostructure consisting of amorphous MnO2, Mn3O4 nanocrystallites, and single-crystalline MnOOH nanowires for supercapacitors," Journal of Power Sources, 2011, vol. 196, pp. 847-850.

Huang et al., "Ultraviolet photoconductance of a single hexagonal WO3 nanowire," Nano Research, 2010, vol. 3, pp. 281-287.

Huang et al., "Controllable synthesis of hexagonal WO3 nanostructures and their application in lithium batteries," 2008, Journal of Physics D: Applied Physics, 2008, vol. 41, 155417, 6pp.

Jacob et al., "Phase diagram of the system Ca—Ti—O at 1200 K," Bull. Mater. Sci., 2009, vol. 32(6), pp. 611-616.

Jitputti et al., "Synthesis of TiO2 nanowires and their photocatalytic activity for hydrogen evolution," Catalysis Communications, 2008, vol. 9, pp. 1265-1271.

Kasuga et al., "Formation of Titanium Oxide Nanotube," Langmuir, 1996, vol. 14, pp. 3160-3163.

Khan et al., "Photoresponse of n-TiO2 thin film and nanowire electrodes," Solar Energy Mater. & Solar Cells, 2003, vol. 76, pp. 211-221.

Kim et al., "Mn2O4 nanorods as lithium ion battery cathodes," Nano Letters, 2008, vol. 8, pp. 3948-3952.

Kim et al., "Design of an efficient microwave plasma reactor for bulk production of inorganic nanowires," Inf. Midem-J. Microelectron. Electron. Compon. Mater., 2008, vol. 38, pp. 237-243.

Komarneni et al., "Nanophase materials by a novel microwavehydrothermal process," Pure Appl. Chem., 2002, vol. 74, pp. 1537-1543.

Kumar et al., "Alkali assisted, atmospheric plasma production of titania nanowire powders and arrays," Crystal Growth & Design, Published Online May 2011, pp. A-G.

Kumar et al., "Gas-Phase, Bulk Production of Metal Oxide Nanowires and Nanoparticles Using a Microwave Plasma Jet Reactor," J. Phys. Chem. C., 2008, vol. 112(46), pp. 17750-17754.

Lakshmi et al., Sol-Gel Template Synthesis of Semiconductor Oxide Micro- and Nanostructures, Chem. Mater., 1997, vol. 9, 2544-2550.

Lau et al., "Synthesis and characterization of TiOx nanowires using a novel silicon oxide support layer," Nanotechnology, 2009, vol. 20(2), p. 025602.

Lee et al., "Synthesis of Titanate Derivatives Using Ion-Exchange Reaction," J. Am. Ceram. Soc., 2000, vol. 83, pp. 1098-1102.

Li et al., "Mesoporous Co3O4 nanowire arrays for lithium ion batteries with high capacity and rate capability," Nano Letters, 2007, vol. 8, pp. 26570.

Li et al., "Freestanding mesoporous quasi-single-crystalline Co3O4 nanowire arrays," Journal of the American Chemical Society, 2006, vol. 128, pp. 14258-14259.

Li et al., "Co3O4 nanomaterials in lithium-ion batteries and gas sensors," Advanced Functional Materials, 2005, vol. 15, pp. 851-857.

Li et al., "Synthesis and characterization of rutile TiO2 nanowhiskers," J. Mater. Res., 1999, vol. 14, pp. 3346-3354.

Limmer et al., "Template-based growth of various oxide nanorods by sol-gel electrophoresis," Adv. Funct. Mater., 2002, vol. 12, pp. 59-64.

Liu et al., "Oriented single crystalline titanium dioxide nanowires," Nanotechnology, 2008, vol. 19, 505604 (7 pp).

Liu et al., "Preparation of Mn3O4 nanowires by calcining the precursor powders synthesized in a novel inverse microemulsion," Applied Physics A: Materials Science & Processing, 2003, vol. 76, pp. 1117-1120.

Miao et al., "Electrochemically induced sol-gel preparation of single-crystalline TiO2 nanowires," Nano Lett, 2002, vol. 2, pp. 717-720.

* cited by examiner

Ti-K-O melt

FIG. 14A  FIG. 14B

METHODS FOR SYNTHESIZING METAL OXIDE NANOWIRES

GOVERNMENT INTEREST

This invention was made with government support under Grant Nos. DE-FG02-07ER46375, DE-FG36-05GO85013, and DE-EE0003206 awarded by the Department of Energy, and by Grant No. IIP-10472175 awarded by the National Science Foundation. The government has certain rights in the invention.

TECHNICAL FIELD

The present invention relates to methods for synthesizing metal oxide nanowires. In particular, the present invention relates to methods for synthesizing transition metal oxide nanowires whereby a transition metal or a transition metal oxide is combined with an alkali metal compound and is then exposed to a plasma discharge to form transition metal oxide nanowires.

BACKGROUND

Transition metal oxide nanowires (nanowires), such as titanium oxide, cobalt oxide, manganese oxide, and tungsten oxide nanowires, are being increasingly utilized in emerging renewable energy technologies such as solar cells [1], lithium ion batteries [2, 37-40], capacitors [41-43], catalysts [44-47], and composites [48]. Each of these applications requires amounts of nanowire materials on the order of several hundred grams for testing and device prototyping. However, current synthesis methods for producing these nanowires are generally only capable of producing a few milligrams in a single batch, thus making the production of sufficient amounts of the transition metal nanowires both time and labor intensive.

Traditionally, liquid-phase hydrothermal methods, which employ high-pressure conditions and multiple steps, have been used to synthesize the nanowire materials [9, 49]. Such hydrothermal methods can result in small amounts of products (1 gram/day) in a batch mode, but the hydrothermal technique itself is generally slow, with reactions occurring over several hours to days, and is thus unsuitable for industrial applications. Two recent modifications to the hydrothermal technique are microwave-hydrothermal [50, 51] and continuous flow hydrothermal methods [52]. These additional techniques have increased the production rate of nanowires to about 5 g/day and 10 g/hr, respectively, with the microwave hydrothermal technique also using microwave radiation energy instead of electrical heating to improve the synthesis time. Nevertheless, the microwave hydrothermal technique has still not been found to be suitable for producing sufficient quantities of transition metal oxide nanowires for testing and device prototyping, and the continuous flow hydrothermal method has been shown to work only for nanoparticles (NPs) and not nanowires. Similarly, other synthesis methods, including electro-deposition [53], sol-gel [54], as well as several other methods, have only been shown to synthesize transition metal oxide nanowires on a milligram scale.

Recently, it has been observed that low-melting metals can be oxidized directly to produce respective metal oxide nanowires [13]. Indeed, such schemes were implemented with thermal oxidation in a horizontal tubular reactor for Zn [55], Sn [56], Ga [57], In [58], and certain high melting metals, such as W [59], Ta [59], Mo [60]. Additionally, another scheme using direct plasma oxidation of certain metals, such as Fe [16], Nb [15], and V [15], to synthesize metal oxide nanowires onto metal foils has also been used. Nevertheless, gas phase synthesis of these transition metal oxide nanowires without any external reagents has proven difficult because of the high melting points of their respective metals and the tendency of the metals to oxidize rapidly, which makes it difficult to melt the metals without the concurrent formation of an oxide vapor plume that then limits the amount of transition metal oxide nanowires that can be obtained.

In any event, known methods of synthesizing transition metal oxide nanowires are only capable of producing small quantities of transition metal oxide nanowires or are only capable of producing transition metal oxide nanowires with the undesirable formation of an oxide vapor plume. Furthermore, none of the known methods address how to produce a sufficient amount of transition metal oxide nanowires in a short amount of time, which is of great importance in producing transition metal oxide nanowires for industrial applications.

SUMMARY

The present invention includes methods for synthesizing transition metal oxide nanowires, as well as transition metal oxide nanowires that are produced in accordance with the methods of the present invention.

In one exemplary implementation, transition metal oxide nanowires are synthesized by first combining an amount of a transition metal or a transition metal oxide with an amount of an alkali metal compound to produce a mixture of the two components. Then, a plasma discharge reactor, such as an atmospheric pressure microwave plasma reactor that is capable of producing highly-dense microwave plasma discharges (e.g., 200 W to 5 kW), is activated to create a plasma discharge having a desired power. The mixture of the transition metal or transition metal oxide with the alkali metal compound is then exposed to the plasma discharge for a first predetermined time period (e.g., 5 seconds to 30 min) to thereby create metal oxide nanowires that incorporate the alkali metal. To remove the alkali metal from the nanowires, the as-synthesized nanowires are subsequently contacted with an acidic solution such that the alkali metal ions on each of the nanowires are exchanged for hydrogen ions. Once the ion exchange has occurred, and the acid solution is rinsed from the transition metal oxide nanowires, the transition metal oxide nanowires are then re-exposed to the plasma discharge for a second predetermined time period (e.g., 5 min) to thermally anneal the transition metal oxide nanowires.

In some implementations of the presently-disclosed methods, the plasma discharge reactor can be positioned such that the plasma discharge is oriented in a direction that allows the transition metal oxide nanowires to be formed by direct gas phase synthesis or by a method where a transition metal or transition metal oxide is combined with an alkali metal compound and is placed on a substrate (e.g., foil) prior to exposing the mixture to the plasma discharge. For example, in some implementations, the plasma discharge can be oriented such that it extends vertically downwards to allow the mixture of the transition metal or transition metal oxide and the alkali metal compound to be fed into the plasma discharge reactor, and the plasma discharge itself, by pouring the mixture into the plasma discharge reactor and the plasma discharge. As another example, in other implementations, the plasma discharge reactor can be oriented such that the plasma discharge extends vertically upward, and the mixture of a transition metal or transition metal oxide and an alkali metal compound can be exposed to the plasma discharge by placing the mixture on a substrate and exposing the substrate with the mixture placed thereon to the plasma discharge. As a further example, in some implementations, the plasma discharge can be oriented such that it extends vertically downwards, and the mixture of a transition metal or transition metal oxide and an alkali metal compound can be exposed to the plasma discharge by placing the mixture on a substrate and exposing the substrate with the mixture placed thereon to the plasma discharge.

The transition metal or transition metal oxides used in accordance with the methods of the present invention can be selected from any of the transition metals or transition metal oxides. In some implementations, the metal is selected from the group consisting of titanium, tungsten, cobalt, and manganese. In other implementations, the metal oxide is selected from the group consisting of titanium oxide, tungsten oxide, cobalt oxide, and manganese oxide.

Similarly, the alkali metal compounds used in accordance with the methods of the present invention can be selected from a number of alkali metal compounds. For example, in some implementations, the alkali metal compound comprises an alkali metal selected from potassium, lithium, or sodium. In some implementations, the alkali metal compound is an alkali metal salt, such as potassium chloride, lithium chloride, or sodium chloride. In other implementations, the alkali metal compound is an alkali metal hydroxide, such as potassium hydroxide, lithium hydroxide, or sodium hydroxide.

Also provided, in some embodiments of the present invention, are transition metal oxide nanowires. In some embodiments, the transition metal oxide nanowires are produced by the methods of the present invention.

Still further provided, in some embodiments of the present invention, are methods for producing lithium silicate nanotubes that include the steps of: combining an amount of silica with an amount of a lithium compound to produce a mixture; activating a means for generating an oxygen radical to form one or more oxygen radicals; and exposing the mixture to the means for generating an oxygen radical for a first predetermined time period such that lithium silicate nanotubes are formed. In some implementations, the silica is a silica powder and the lithium compound is lithium hydroxide.

Further features and advantages of the present invention will become evident to those of ordinary skill in the art after a study of the description, figures, and non-limiting examples in this document.

BRIEF DESCRIPTION OF THE DRAWINGS

FIG. 5A); potassium hydroxide (KOH; FIG. 5B); sodium chloride (NaCl; FIG. 5C); lithium chloride (LiCl; FIG. 5D); sodium hydroxide (NaOH; FIG. 5E); and calcium chloride ($CaCl_2$; FIG. 5F) placed on Ti foil in accordance with the nanowire synthesis methods of the present invention;

FIGS. 14A-14C include SEM images of raw potassium titanate powder (FIG. 14A) and as-synthesized potassium titanate nanowire powders (FIG. 14B), as well as an XRD spectra of the as-synthesized potassium titanate nanowire powders (FIG. 14C).

DESCRIPTION OF EXEMPLARY EMBODIMENTS

Figure 1A:
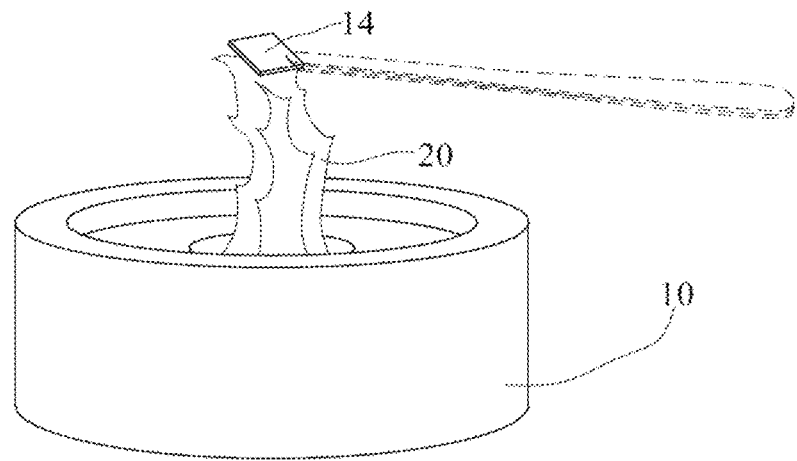
FIGS. 1A-1B include drawings of plasma discharge reactors and plasma discharges used in accordance with the presently-disclosed subject matter, including a drawing of an upward, open, flame-like plasma discharge (FIG. 1A) and a drawing of a plasma discharge extending vertically downward inside of a quartz tube (FIG. 1B)

The present invention includes methods for synthesizing transition metal nanowires, as well as transition metal nanowires that are produced by the synthesis methods.

It has been observed that a transition metal oxide nanowire can be synthesized with a synthesis time on the order of minutes from respective transition metal or transition metal oxide precursors by mixing the transition metal or transition metal oxide precursors with alkali metal compounds and then exposing the mixture directly to a microwave plasma discharge. In particular, it has been observed that the methods described herein allow alkali compounds to act as a solvent medium and also allow oxygen (e.g., an oxygen radical or a hydroxyl radical) from the air plasma to act as an oxidant such that, upon exposure to the plasma discharge, the transition metals or transition metal oxides are dissolved in the alkali metal compounds and are then oxidized by the plasma discharge to form transition metal nanowires.

In one exemplary implementation of the present invention, transition metal oxide nanowires are synthesized by first combining an amount of a transition metal or a transition metal oxide with an amount of an alkali metal compound to produce a mixture of the two components. The amounts of alkali metal used to produce the mixture are generally in excess of the amounts of transition metals or transition metal oxides utilized such that sufficient alkali metals are available to react with the transition metals or transition metal oxides. For example, in certain implementations, the amounts transition metals or transition metal oxides comprise about 5% to about 10% of the amounts of alkali metals in the mixture.

Once the transition metal or a transition metal oxide is mixed with the alkali metal compound, a plasma discharge reactor is then activated to create a plasma discharge having a desired power. Typically, the plasma discharge reactor utilized in accordance with the methods of the present invention is one that is capable of producing a plasma discharge having a suitable power under atmospheric conditions, such that sufficient heat is created to melt and facilitate the oxidation of the transition metal or transition metal oxides, via then generation of oxygen radicals by the plasma discharge, and thereby form the transition metal oxide nanowires. For example, in one implementation, an atmospheric pressure microwave plasma discharge reactor can be utilized that makes use of a gaseous mixture of 2 lpm Argon, 11 lpm air, and 1000 sccm $H_2$ that is fed into the top of the plasma discharge reactor to ignite and maintain a plasma discharge at powers ranging from 500 W to 3 kW under atmospheric pressure conditions. Such an atmospheric pressure microwave plasma discharge reactor is further described in Kumar, et al. *J Phys Chem C* 2008, 112, 17750, and in Kim, et al. *Inf Midem-J. Microelectron, Electron. Compon. Mater.* 2008, 38, 237, each of which are incorporated herein by this reference. However, it is further contemplated that other plasma discharge reactors, utilizing other gaseous mixtures, power ranges, and/or pressure conditions can also be used without departing from the spirit and scope of the present invention.

Moreover, in addition to plasma discharge reactors, other means for creating oxygen radicals can also be used in accordance with the presently-described methods for creating nanowires, including, but not limited to, microwave discharges at atmosphere or at low temperature; radio frequency discharges at low pressures and at atmospheric pressures, hot filaments or wires that are capable of producing plasma discharges, other means for producing high thermal temperatures, various chemical means for producing oxygen radicals (e.g., ozone), as well as many other means for producing oxygen radicals.

Following the activation of the plasma discharge reactor, the mixture of the transition metal or transition metal oxide with the alkali metal compound is then exposed to the plasma discharge for a first predetermined time period to thereby create metal oxide nanowires that incorporate the alkali metal. The length of the first predetermined time period will, of course, depend on the particular transition metal or transition metal oxide, the particular alkali metal compound, the particular gaseous mixture and pressure conditions used with the plasma discharge reactor, and/or the power of the plasma discharge. However, it has been experimentally observed that by using a plasma discharge reactor at powers ranging from about 200 W to 5 kW under atmospheric conditions, the mixture of the transition metal or transition metal oxide with the alkali metal compound can be exposed to the plasma discharge for about 5 seconds minutes to about 15 or about 30 minutes to create nanowires of a sufficient quality for industrial applications. Of course, to the extent it may be desired, the quality and morphology of the nanowires can be adjusted by varying the exposure time and can be adjusted for a particular application using only routine experimentation.

With further respect to the step of exposing the mixture of the transition metal or transition metal oxide with the alkali metal compound to the plasma discharge, in some implementations, the plasma discharge reactor can be positioned such that the plasma discharge is oriented in a direction that allows the transition metal oxide nanowires to be formed by direct gas phase synthesis or by a method where the mixture is placed on a substrate (e.g., foil) prior to exposing the mixture to the plasma discharge.

Figure 1B:
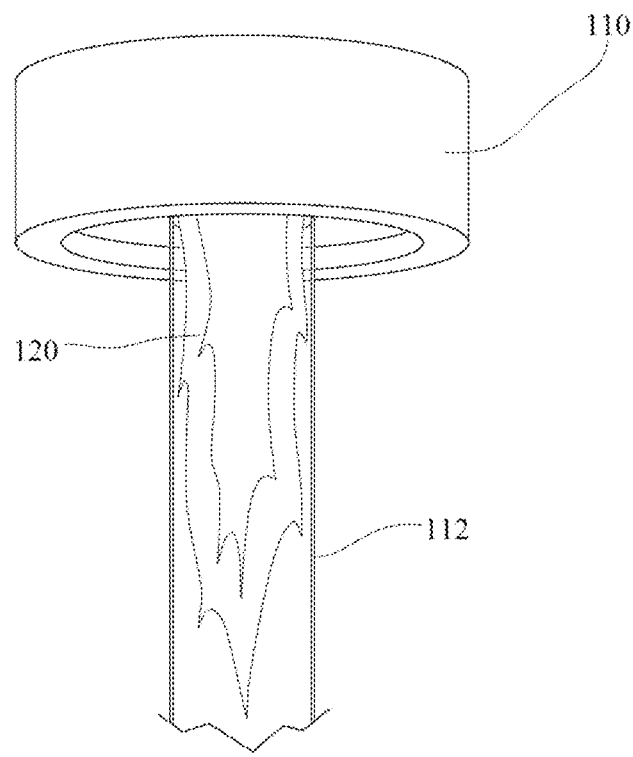

For example, in some implementations and as shown in FIG. 1B, the plasma discharge reactor 110 can be oriented such that the plasma discharge 120 extends vertically downwards inside of a quartz tube 112 to allow the mixture of the transition metal or transition metal oxide and the alkali metal compound to be fed (e.g., poured) into the plasma discharge reactor 110, and the plasma discharge 120 itself, such that a direct gas phase synthesis of the transition metal oxide nanowires is achieved.

Figure 8:
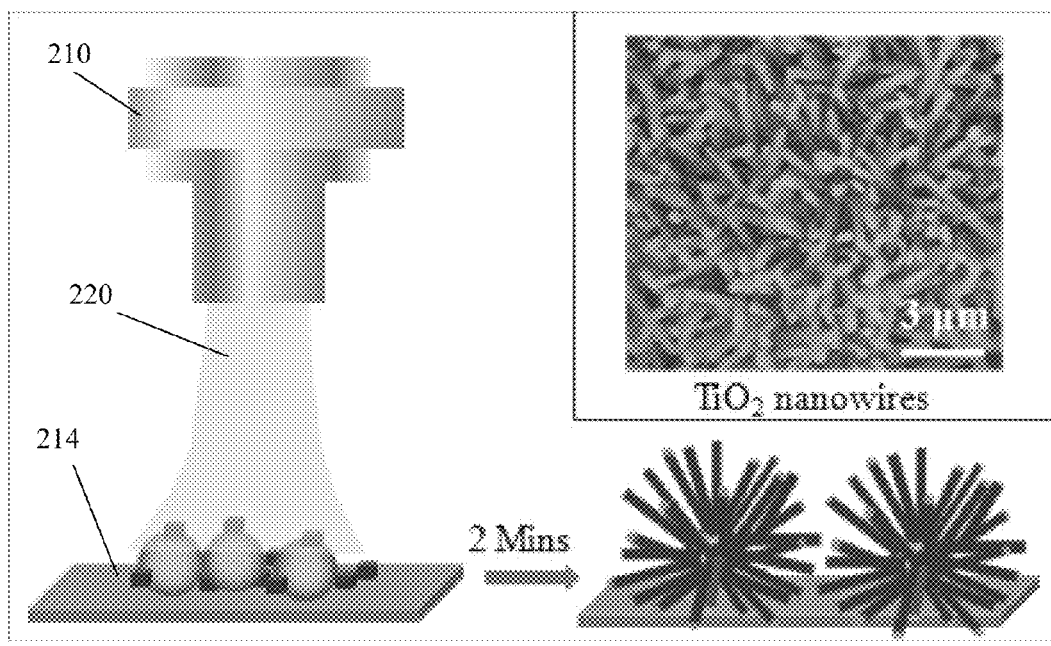
FIG. 8 is a schematic diagram depicting an exemplary method of synthesizing transition metal oxide nanowires in accordance with the present invention, where a plasma discharge extends vertically downward and is used to generate $TiO_2$ nanowires.

As another example, in some implementations and as shown in FIG. 8, a plasma discharge reactor 210 can be oriented downward such that the plasma discharge 220 extends vertically downward and the mixture of a transition metal or transition metal oxide and an alkali metal compound can be exposed to the plasma discharge 220 by placing the mixture on a substrate 214, and then placing the substrate 214 under the plasma discharge 220 such that the mixture is exposed to the plasma discharge 220.

As yet another example, in other implementations and as shown in FIG. 1A, the plasma discharge reactor 10 can be oriented such that the plasma discharge 20 extends vertically upward and the mixture of a transition metal or transition metal oxide and an alkali metal compound can be exposed to the plasma discharge 20 by first placing the mixture on a substrate 14 and then exposing the substrate 14, with the mixture placed thereon, to the plasma discharge 20.

Figure 7:
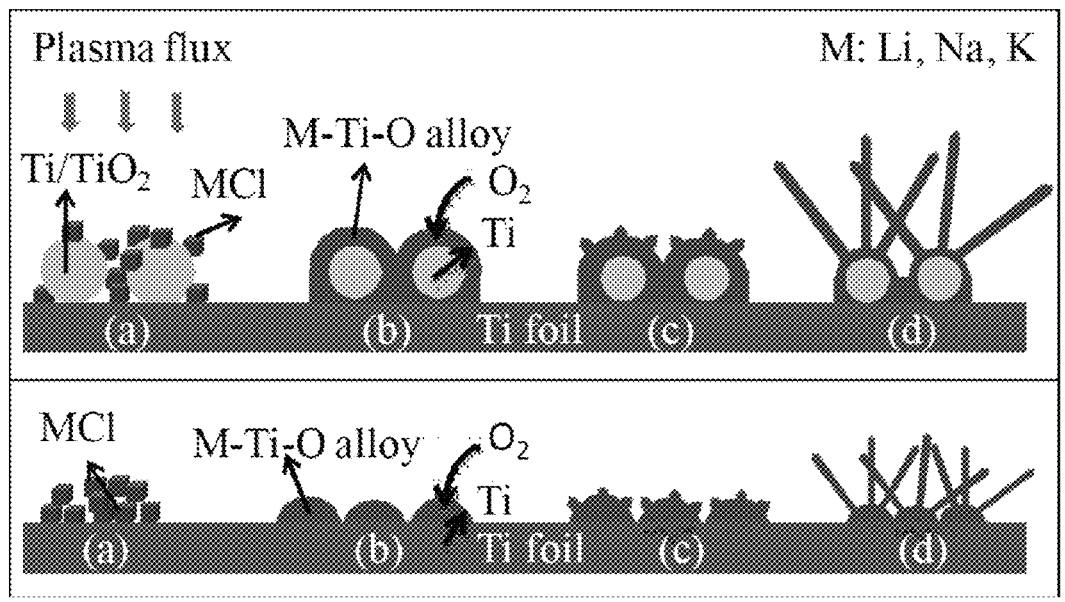
FIG. 7 is a schematic diagram depicting an exemplary growth mechanism for alkali metal compound-assisted (e.g., compounds involving Li, Na or K) growth of $TiO_2$ nanowires, with the top schematic showing nanowire formation when Ti or $TiO_2$ powder is used and the bottom schematic showing formation on Ti foil only, with the steps in each schematic being: (a) feed mixture placement onto Ti foil; (b) alkali metal compound alloying of Ti species to form K—Ti—O alloy; (c) super saturation leading to titanate nuclei formation; and (d) basal growth of titanate nanowires.

Various substrates, including metal foils (e.g., an iron foil or a titanium foil), may be utilized as a substrate in accordance with the present invention. However, regardless of the particular substrate utilized, it has been experimentally observed that the formation of metal oxide nanowires on the substrate generally follows at least four growth steps as shown in FIG. 7. These growth steps include: (a) the formation and melting of the alkali metal from the alkali metal compounds (e.g., an alkali metal salt); (b) the alloying of molten alkali metal with the transition metal or transition metal oxide to form transition metal-alkali metal-oxygen alloys, which lowers the melting point of the transition metal due to eutectic formation; (c) the continuous dissolution of the transition metal, which leads to phase segregation and bulk nucleation; and (d) the basal growth of nuclei from the dissolved transition metal species.

As one exemplary implementation of the methods for synthesizing metal oxide nanowires of the present invention, which makes use of a plasma discharge extending vertically upward, $TiO_2$ anatase powder or Ti metal powders were mixed with either KCl or NaCl, LiCl, NaOH, or KOH, and the mixture was placed on either Ti foil, Fe foil, or graphite foil. The conversion of that raw powder to alkali titanate nanowires then resulted when the mixture was exposed to an upward microwave plasma discharge operating at a power of 700-1000 W for 2-3 minutes. The as-synthesized nanowires in this implementation of the method were observed to have a diameter in the range of 50-500 nm and a length in the range of 5-30 μm, and the alkali titanate that was synthesized was determined to be $K_2Ti_8O_{17}$. $TiO_2$ nanowires were subsequently obtained when the as-synthesized titanate nanowires were dipped in 1M HCl for a time ranging from 5 min-1 hr to exchange ions on the nanowires and were then annealed by exposing to plasma flame for 5 minutes, as described further below.

As another exemplary implementation of a method for generating transition metal oxide nanowires using a plasma discharge that extends vertically upwards, $Co_2O_3$ powder was mixed with KCl and was placed on Co foil prior to vertical, open-flame, microwave plasma exposure at 700-900 W for 2-3 minutes. The as-synthesized nanowires in this implementation were observed to be very long and bent $Co_3O_4$ nanowires.

As a further exemplary implementation of a method for generating transition metal oxide nanowires using an plasma discharge that extends vertically upwards, Mn powder (micron size) was mixed with KCl and was placed on graphite foil prior to vertical, open-flame microwave plasma exposure at 700-900 W for 2-3 minutes. The as-synthesized nanowires in this implementation were observed to be very long, beaded, and bent nanowires (500 nm diameter and approximately 10 μm in length) of $Mn_3O_4$.

As yet another exemplary implementation of a method for generating transition metal oxide nanowires using an plasma discharge that extends vertically upwards, W powder (micron size) was mixed with KCl and placed on graphite foil prior to vertical, open-flame, microwave plasma exposure at 700-900 W for 2-3 minutes. The as-synthesized nanowires in this implementation were observed to be straight, cylindrical nanowires (500 nm in diameter and approximately 10 μm in length) of $WO_3$.

As an even further exemplary implementation of a method for generating transition metal oxide nanowires using an plasma discharge that extends vertically upwards, Si powder (micron size) was mixed with LiOH and was placed on graphite foil prior to vertical, open-flame, microwave plasma exposure at 700-900 W for 2-3 minutes. The as-synthesized nanowires in this implementation were observed to be in Li-doped $SiO_2$ nanowires or lithium silicate nanowires with a porous structure and with a diameter less than 100 nm.

In some embodiments of the presently-disclosed methods, the transition metals or transition metal oxides can be provided directly in the form of foils such that an alkali compound (e.g., an alkali salt) can be placed directly on the metal foils to produce nanowire arrays. For example, in certain embodiments, alkali salts can be placed on titanium foil and exposed to a plasma discharge (e.g., an oxygen radical flux) to produce alkali titanate nanowire arrays with nanowires as longs as hundred of microns directly on the foils. In some embodiments, the metal foils can be selected from titanium, tungsten, and molybdenum, among others. In some embodiments, the time of exposure to a plasma discharge in these synthesis methods making use of foils is from about 5 seconds to about 15 minutes.

Turning now to the step of exchanging ions on the as-synthesized nanowires, in order to remove the alkali metal from the as-synthesized nanowires, the as-synthesized nanowires are subsequently contacted with an acidic solution such that the alkali metal ions on each of the nanowires are exchanged for hydrogen ions. Such ion exchanges methods are known to those of ordinary skill in the art as a means to convert alkali-metal oxide nanowires, such as sodium-titanate nanowires, to metal oxide phase nanowires, such as $TiO_2$ nanowires. It has now been experimentally observed, however, that previously-reported ion exchange methods can also be used in accordance with the methods of the present invention and can be extended to remove a variety of different alkali metals from the as-synthesized nanowires of the present invention. For further explanation and guidance regarding ion exchange methodologies, see, e.g., Liu, et al. Nanotechnology, 2008, 19, 505604; and Peng, et al. Adv. Funct. Mater. 2006, 16, 1355, each of which is incorporated herein by this reference.

Once the ion exchange has occurred, and the acid solution is rinsed from the transition metal oxide nanowires, the transition metal oxide nanowires are then re-exposed to the plasma discharge for a second predetermined time period to thermally anneal the transition metal oxide nanowires. By utilizing the plasma discharge to thermally anneal the transition metal oxide nanowires, it has been determined that the transition metal oxide nanowires can typically undergo thermal annealing in 5 minutes or less, which is significantly less than currently-utilized thermal annealing steps that are conducted over 3 to 6 hours.

With respect to the transition metals or transition metal oxides that can be used in accordance with the present invention, the transition metals or transition metal oxides can be selected from any of the transition metals or transition metal oxides known to those of ordinary skill in the art. In some implementations, the metal can be selected from the group consisting of titanium, tungsten, cobalt, and manganese. In some implementations, the metal oxide can be selected from the group consisting of titanium oxide, tungsten oxide, cobalt oxide, and manganese oxide.

Similarly, the alkali metal compounds used in accordance with the methods of the present invention can be selected from a number of alkali metal compounds known to those skilled in the art. For example, in some implementations, the alkali metal compound comprises an alkali metal selected from potassium, lithium, or sodium. In some implementations, the alkali metal compound is an alkali metal salt, such as potassium chloride, lithium chloride, and sodium chloride. In other implementations, the alkali metal compound is an alkali metal hydroxide, such as selected from the group consisting of potassium hydroxide, lithium hydroxide, or sodium hydroxide. In some embodiments, the alkali metal compound is an alkali metal halide.

Further provided, in some embodiments, of the present invention are transition metal oxide nanowires. In some embodiments, transition metal oxide nanowires are provided that are produced by: combining an amount of a transition metal or a transition metal oxide with an amount of an alkali metal compound to produce a mixture; activating a plasma discharge reactor to create a plasma discharge; exposing the mixture to the plasma discharge for a first predetermined time period such that transition metal oxide nanowires are formed; contacting the transition metal oxide nanowires with an acid solution such that an alkali metal ion is exchanged for a hydrogen ion on each of the transition metal oxide nanowires; and exposing the transition metal oxide nanowire to the plasma discharge for a second predetermined time period to thermally anneal the transition metal oxide nanowires.

Still further provided, in some embodiments of the present invention, are methods for producing lithium silicate nanotubes. In some embodiments, a method for producing lithium silicate nanotubes is provided that include the steps of: combining an amount of silica with an amount of a lithium compound to produce a mixture; activating a means for generating an oxygen radical to form one or more oxygen radicals; and exposing the mixture to the means for generating an oxygen radical for a first predetermined time period such that transition metal oxide nanowires are formed. In some implementations, the silica is a silica powder and the lithium compound is lithium hydroxide.

The above-described methods for synthesizing metal oxide nanowires and nanotubes, which allow for the rapid synthesis of metal oxide nanowires and nanotubes in large quantities, are important for producing high-quality nanowires and nanotubes that can then be used in a number of industrial applications. For example, titanium oxide nanowires can be produced and used in industrial applications such as solar cells, nanocomposites, optical films, and paints, while titanium oxide, manganese oxide, cobalt oxide, and tungsten oxide nanowires can be used as catalysts and as capacitors. Thus, the methods of the present invention provide convenient alternatives to current nanowire and nanotube synthesis techniques, with the added benefit that the nanowires and nanotubes produced by the presently-disclosed methods are synthesized rapidly and in large quantities, thus making them suitable for many industrial applications.

The presently-disclosed subject matter is further illustrated by the following specific but non-limiting examples.

EXAMPLES

Example 1

Alkali Assisted, Atmospheric Plasma Production of Titania Nanowire Powders and Arrays To determine the feasibility of directly synthesizing $TiO_2$ nanowires as part of a gas-phase method using direct oxidation of either Ti metal foils or powder of spherical $TiO_2$ powders, experiments were performed using a newly designed microwave plasma reactor [22-23]. Briefly, the reactor was capable of producing highly dense microwave plasma discharges at powers ranging from 500 W to 3 kW at atmospheric conditions, and the plasma flame could be shaped vertically upwards (for foil exposure experiments as shown in FIG. 1A) or downwards (for powder feeding experiments as shown in FIG. 1B) depending upon the experimental requirements. A gaseous mixture of 2 lpm Ar, 11 lpm Air, and 1000 sccm $H_2$ was fed at the top of the reactor to ignite and maintain the plasma throughout the duration of the experiments. A 1×1 cm piece of Ti foil was cut from a Ti foil (100×100 mm, 0.5 mm thick, from Alfa Aesar, Ward Hill, Mass.) and was filed on both sides using a rectangular file. The filed Ti foil was then ultrasonicated for 5 min to clean the surface. A small amount of Ti powder (65 μm size) was then mixed with alkali metal salt crystals and sprinkled together on the top of the Ti foil, which was then carefully exposed to the plasma flame at power of 800-1000 W (FIG. 1A) for about 5 minutes. In direct gas phase synthesis experiments, metal or metal oxide powder mixed with alkali salt crystals was poured from the top of the reactor and collected at the bottom in a cup. The as-synthesized material was then dipped in 1 M HCl solution for 1 h for ion exchange, and was subsequently washed with de-ionized water and annealed by exposure to the plasma flame for 5 min. The material was then characterized using a field emission scanning electron microscope (FE-SEM; FEI Nova 600), an X-ray diffraction (XRD; Bruker D8 Discover), a Renishaw in-via micro-Raman/photoluminescence spectroscope, and a transmission electron microscope (TEM; Tecnai F20 FEI TEM with a GATAN 2002 GIF system).

Upon analysis of the results from the experiments, it was observed that the experiments on direct gas phase oxidation, which included pouring Ti powder with no foreign metals from the top of the reactor in a set-up as shown in FIG. 1B, resulted in $TiO_2$ nanoparticles (NPs) instead of nanowires, while similar experiments using other metals such as Sn, Zn and Al powders resulted in nanowires [22]. In this regard, the results with titania were different and could be explained using gas-solid equilibrium thermodynamics and the corresponding metal oxide vapor pressures. Ti metal is prone to oxidation because of exothermic heat of reaction $(Ti(s)+2O \rightarrow TiO_2(s), \Delta H=-1445\ kJ/mol)$ and it forms a large amount of $TiO_2$ vapor plume as soon as it is poured in the quartz tube resulting in deposition on the tube walls. Theoretical gas phase equilibrium mole fraction calculations (EQUIL code using CHEMKIN Software by Reaction Design Inc., San Diego, Calif.) also confirmed that the $TiO_2$ is the preferred species both in the solid and vapor phase in $O_2$ excess conditions ($Ti/O_2$ molar ratio <1) at temperatures ranging from 1000-2500 K. $TiO_2$ mole fraction is at least $10^9$ and $10^{21}$ times higher than TiO and Ti, respectively, which favors the formation of $TiO_2$ NPs.

In order to perform experiments to oxidize molten Ti particles without the formation of an oxide vapor plume, a set of experiments were then conducted using lower plasma powers of 500 W, 100 sccm $H_2$, and 7 lpm air. These experiments resulted in one-dimensional "nanowire-like" structures (approximately 1 μm length) of $TiO_2$ in a flowery pattern.

Figure 2A:
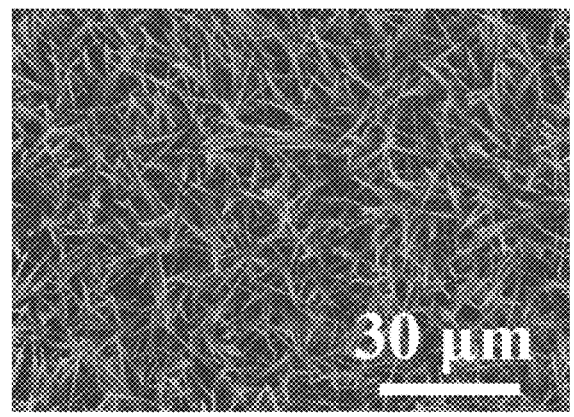
FIGS. 2A-2C are scanning electron microscope (SEM) images showing a top view (FIG. 2A) and a cross-sectional view (FIG. 2B) of titanium oxide ($TiO_2$) nanowires (nanowires) obtained by plasma oxidation of titanium (Ti) foil in the presence of sprinkled potassium chloride (KCl), and showing a top view (FIG. 2C) of nanowires obtained with plasma oxidation of Ti metal powder mixed with KCl and supported on Ti foil.
Figure 2B:
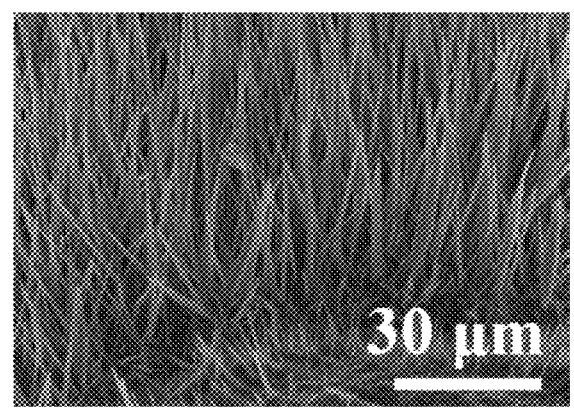
Figure 2C:
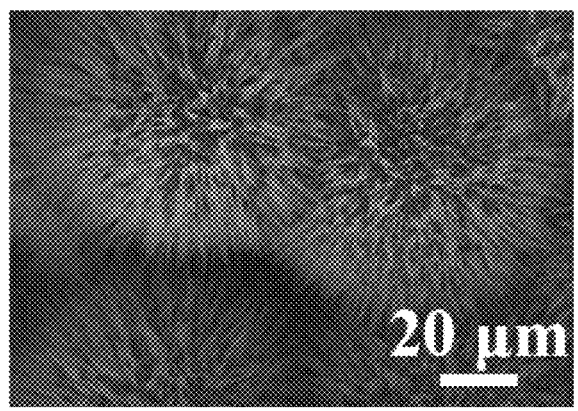

Subsequent to the foregoing experiments, experiments were then conducted that were similar to hydrothermal synthesis techniques using plasma oxidation in the presence of alkali metal compounds. In these experiments, a Ti source (such as Ti metal powder of 65 μm size, and $TiO_2$ powder) mixed with alkali metals compounds (e.g., KCl) in a 50:50 wt % ratio was supported on Ti foil and was exposed to microwave plasma power of 800-950 W and 11 lpm of air for short periods of 2-5 minutes in a set-up as shown in FIG. 1A. These experiments resulted in high density of nanowires (greater than 50 μm in length) in an array form emanating vertically from foils (top and cross-sectional view shown in FIGS. 2A and 2B, respectively) and radially from spherical particles (FIG. 2C; samples shown in FIGS. 2A and 2C were synthesized under the same conditions except that the sample utilized in FIG. 2A was obtained directly on Ti foil whereas the sample in FIG. 2C was obtained by placing Ti powder on Ti foil). The results with plasma exposure of $TiO_2$ powder and KCl mixture on Ti foil (32 nm size, anatase) showed complete conversion of spherical particles into straight nanowires similar to the above experiments shown in FIG. 2A. $TiO_2$ NPs are less expensive and are readily available from commercial sources, making them a desirable raw material for commercial scale production of $TiO_2$ nanowires. Similar experiments done using Ti metal powders mixed with KCl supported on Fe foil (instead of Ti foil) resulted in a similar result with flowery pattern of nanowires from individual Ti metal powders, indicating that the Fe foil provided the support needed for proper mixing of Ti and alkali sources and further indicating that a Ti substrate, while facilitating the proper mixing of the reagents, was not essential for nanowire formation. Results from these experiments indicates that nanowire synthesis requires: (1) a Ti source, (2) an alkali metal reagent, and (3) proper contact and mixing between these upon plasma exposure.

Subsequent to the foregoing experiments, it was believed that the scalability of the above-describes technique could be established when nanowires were obtained through direct gas phase oxidation experiments in a vertical plasma reactor (without the support of any substrate) using spherical $TiO_2$ or Ti metal powders. In this regard, experiments were then performed by pouring Ti or $TiO_2$ powders mixed with KCl crystals (50:50 wt %) into the top of the reactor using similar experimental conditions as those used for the data (foil exposure experiments) shown in FIG. 2B. In these latter experiments, nanowires resulted when sub-micron scale $TiO_2$ powder was used as feedstock, but were not obtained when sub-100 micron size Ti metal powders were used due to the enhanced mixing and better contact that was obtained with smaller size $TiO_2$ powders. These experiments using sub-micron size $TiO_2$ powders were converted to nanowire powders with 5% efficiency. At the same time, the experiments using $TiO_2$/KCl mixture in a boron nitride (BN) crucible exposed to plasma under similar conditions resulted in a more efficient conversion to nanowires (over 20% fraction in resulting powders). In the above experiments using crucible supported powders, the resulting nanowires were shorter in length (about micron) and 100 nm diameter, with the short lengths being due to a smaller residence time (<1 s) and less feed mixture contact in direct gas phase set up. It was also found that the plasma flame in the above-described reactor can treat about 3-5 grams/min of feed powder and can produce about 1 kg/day of nanowires, which can be achieved either in a direct gas phase or by using a conveyor belt type setup.

Figure 3A:
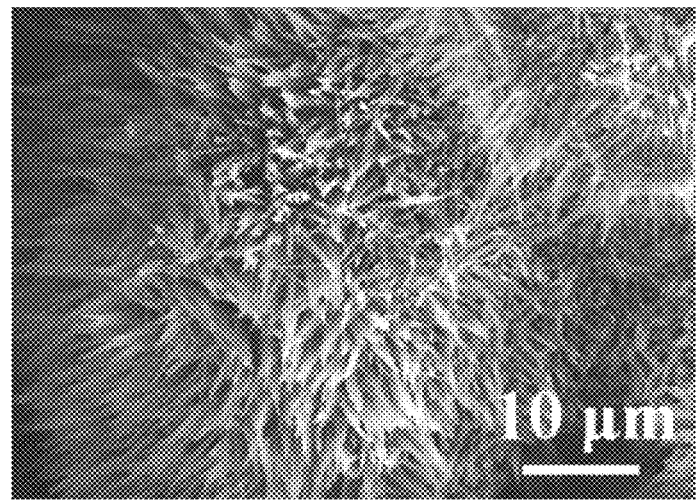
FIGS. 3A-3B are SEM images showing the effect of adding a large amount of KCl to Ti powder onto Ti foil in nanowire formation (FIG. 3A), and showing the effect of plasma power on nanowire formation (FIG. 3B), where a longer exposure time (10 min) produced a degraded Ti sphere (FIG. 3B, inset) with randomly oriented nanowires.
Figure 3B:
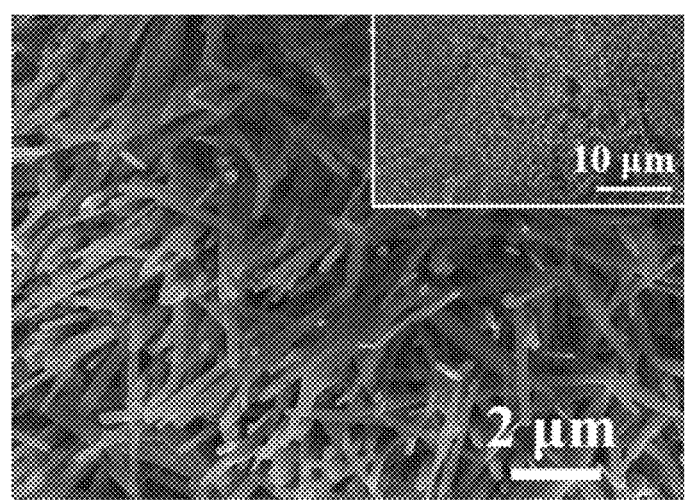

Experiments were then also conducted to understand the factors affecting the morphology (diameter and density) of the resulting nanowires by varying plasma parameters, exposure time, amount of KCl, and gas flow ratio ($H_2$/Air). The nanowire diameter and length increased when the KCl to Ti powder ratio was high and vice versa. In the experiments using spherical Ti powders, the addition of a higher KCl amount also resulted in higher density of nanowires (compared to the result in FIG. 2C) growing radially and laterally as shown in FIG. 3A. Experiments conducted by adding $H_2$ to other feed gases resulted in thinner diameter nanowires. Plasma exposure time variation experiments were not reproducible because of very fast reaction time scales (2-5 min); however, 5 min appeared to be the preferable exposure time for the production of good quality nanowires. Additionally, experiments using higher plasma power appeared to degrade the Ti sphere surface making the resulting nanowires extend randomly in all directions (FIG. 3B).

Figure 4A:
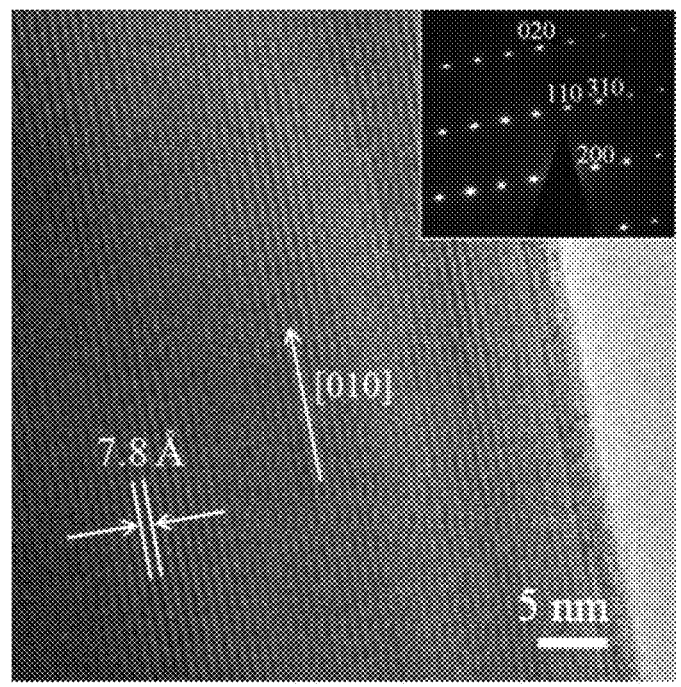
FIGS. 4A-4B are high-resolution transmission electron microscope (HRTEM) images of as-synthesized titanate nanowires (FIG. 4A) and rutile $TiO_2$ nanowires (FIG. 4B) that were obtained after ion exchange and annealing along with their respective selective areas of electron defraction (SAEDs) in the insets.

The as-synthesized nanowires contained about 6-7% of K as determined using an energy-dispersive X-ray spectroscopy (EDX) technique. There was no tip or amorphous oxide sheath around the wire and the K incorporation was observed throughout the nanowire (Cl was not seen as it was believed to be expunged in the gaseous form during the plasma exposure). High Resolution TEM (HRTEM) and selected area electron diffraction (SAED) analysis, shown in FIG. 4A, along with EDX revealed that the as-synthesized nanowires are of a $K_2Ti_8O_{17}$ monoclinic phase with a single crystalline layered structure. From SAED, the planes normal to nanowire growth direction were observed to be (200) planes with interplanar spacing of 7.8 Å, which matched the reported values of $d_{200}$ for $K_2Ti_8O_{17}$ [21, 24, 25]. In this regards, a typical hydrothermal reaction using a Ti source, such as $TiO_2$ powder or Ti foil, and KOH can be represented by reactions 1 and 2 respectively.

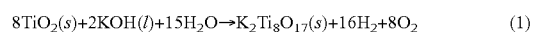

$$8TiO_2(s)+2KOH(l)+15H_2O \rightarrow K_2Ti_8O_{17}(s)+16H_2+8O_2 \qquad (1)$$

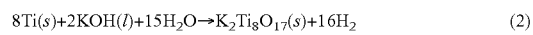

$$8Ti(s)+2KOH(l)+15H_2O \rightarrow K_2Ti_8O_{17}(s)+16H_2 \qquad (2)$$

Whereas, the plasma exposure of $TiO_2$ powder in the presence of alkali compounds, e.g., KOH or KCl, can be expressed by reactions 3 and 4 respectively.

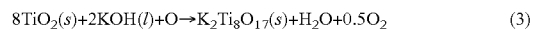

$$8TiO_2(s)+2KOH(l)+O \rightarrow K_2Ti_8O_{17}(s)+H_2O+0.5O_2 \qquad (3)$$

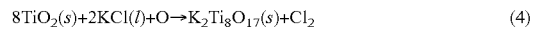

$$8TiO_2(s)+2KCl(l)+O \rightarrow K_2Ti_8O_{17}(s)+Cl_2 \qquad (4)$$

Reaction 3 is more spontaneous and favorable than reaction 1 by 3077 kJ/mol based on ΔG calculations at 1200 K. Comparing reactions 3 and 1, the presence of more reactive O species (compared to $H_2O$ in reaction 1) provided by the plasma exposure in reaction 3 plays a role in making reaction 3 more favorable. Also, in both reactions 3 and 4, O in LHS can also be contributed from a combination of ($O^+$+e or $O^{2+}$+2e) and KCl from a combination of ($K^+$+$Cl^-$ or $K^+$+Cl+e or K+$Cl^+$+e). It is believed that the creation of such radicals in a highly dense microwave plasma discharge and their participation in the reactions 3 and 4 can make these reactions highly spontaneous. For example, replacing O with $O^+$+e and $O^{2+}$+2e make reactions 3 and 4 more spontaneous and favorable (i.e., more negative) by 1286 and 789 kJ/mol based on ΔG calculations at 1200 K. Similarly, replacing KCl with $K^+$+$Cl^-$ or $K^+$+Cl+e or K+$Cl^+$+e make reactions 3 and 4 more spontaneous by 460, 759 and 1593 kJ/mol, respectively, based on ΔG calculations at 1200 K.

There is an established procedure for converting sodium titanate nanowires to $TiO_2$ phase nanowires by ion exchange in acids followed by annealing at high temperatures [11, 12], but such a procedure has not reported for potassium titanate nanowires. Also, the annealing step at high temperatures is typically conducted for times ranging from 3-6 hours. In the present experiments, the resulting titanate nanowires were reacted with dilute HCl (1M) for one hour similar to the reported procedure [11, 12]. The ion-exchange reaction can be represented by reaction 5:

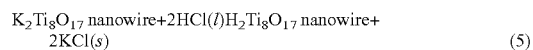

$$K_2Ti_8O_{17}\text{ nanowire}+2HCl(l) \rightleftharpoons H_2Ti_8O_{17}\text{ nanowire}+2KCl(s) \qquad (5)$$

In the following step (reaction 7), the resulting product was annealed using exposure to the same atmospheric plasma setup for approximately 5 minutes or less instead of a thermal annealing step (reaction 6) requiring hours.

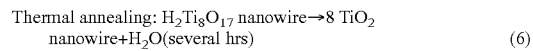

$$\text{Thermal annealing: } H_2Ti_8O_{17}\text{ nanowire} \rightarrow 8\text{ }TiO_2 \text{ nanowire}+H_2O(\text{several hrs}) \qquad (6)$$

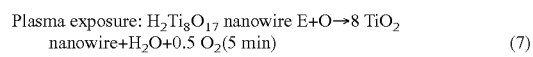

$$\text{Plasma exposure: } H_2Ti_8O_{17}\text{ nanowire E}+O \rightarrow 8\text{ }TiO_2 \text{ nanowire}+H_2O+0.5\text{ }O_2(5\text{ min}) \qquad (7)$$

In both cases, bonds are broken and a water molecule is removed by topotactic transformation [11] preserving the nanowire morphology. In thermal annealing, the bonds are broken and diffuse to the surface of the nanowire, then recombine to form water vapor and desorb from the nanowire surface. In plasma exposure, however, the oxygen radicals can diffuse and actively help break the bonds and can also help with recombination reactions on the surface to release water and oxygen molecules from nanowire surface. The oxygen radical mediation can enhance the kinetics of all elementary steps involved in the water molecule desorption for transforming titanate to $TiO_2$ nanowires. Also, plasma exposure (reaction 7) is more favorable than thermal annealing (reaction 6) by 174 kJ/mol based on $\Delta G$ calculations at 1200 K.

Figure 4B:
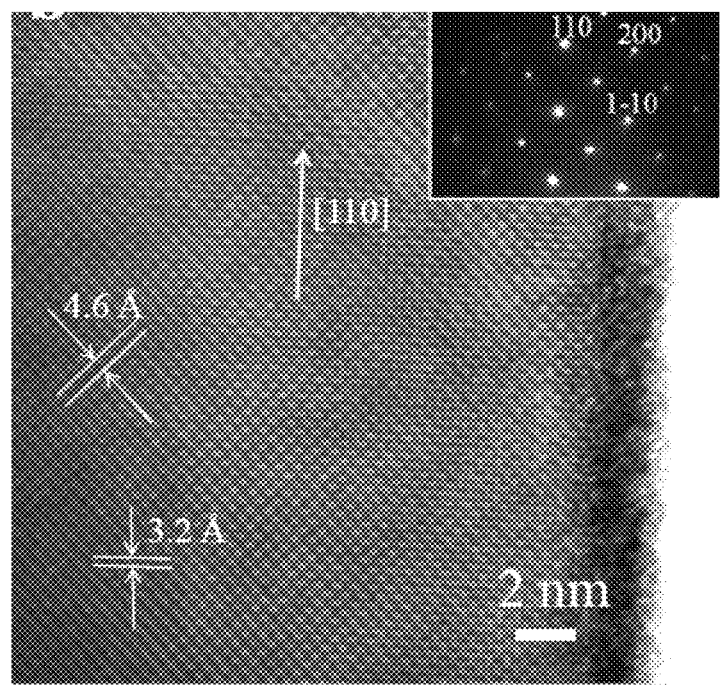

EDX analysis after ion exchange and annealing showed complete removal of K and Ti/O ratio matched with $TiO_2$. XRD spectrum of annealed nanowires shows their phase to be rutile with lattice parameters of a=b=4.593 Å and c=2.959 Å and matches with JCPDS file number 65-0191. A sharp peak at 27.6° shows the characteristic of a highly crystalline rutile phase which is confirmed from HRTEM analysis. The rutile structure was also confirmed by Raman spectroscopy, which shows peaks at 447 and 611 $cm^{-1}$. FIG. 4B shows the HRTEM image and corresponding SAED along [001] zone axis of a $TiO_2$ nanowire. The $TiO_2$ nanowires are single crystalline without any amorphous oxide layer and from SAED their growth direction is determined to be [110] as shown in FIG. 4b. The interplanar spacing of 3.2 Å in (110) planes (which are among the most thermodynamically stable planes in the rutile), obtained from lattice fringes in FIG. 4B is in agreement with d-spacing of (110) rutile planes. Also, lattice fringe spacing of 4.6 Å along either (100) or (010) plane matches with the lattice parameter (a or b) of the rutile $TiO_2$. In the case of thermal annealing, it has been shown to obtain different phases of $TiO_2$ by annealing at different temperatures.

Example 2

Analysis of Mechanistic Studies to Elucidate the Nucleation and Growth of $TiO_2$ Nanowires Produced Using Alkali Metals and Plasma Oxidation Prior studies have suggested that 1D-titanate structures are formed due to a layered structure for titanates, which allows "oriented attachment" [12, 26-28]. In one study, such oriented attachment was hypothesized to result from $K_2O$-rich liquid melt (of $TiO_2$ and alkali compound), but the 1-D growth resulted from the melt quenching in 1-D channels [29]. Another hypothesis predicted that the nanowires grew by oriented relation between the crystallographic planes of anatase matrix and the titanate nuclei [30]; however, the reasons for nucleation and one-dimensional growth for layered titanate were not clear when compared to two dimensional and spherical shapes. Also, the factors that determine the resulting diameters were not understood. In this regard, several experiments were conducted to determine the underlying role of alkali metals in the nucleation and growth of $TiO_2$ nanowires during plasma oxidation, and, during the course of these experiments, it was found that the following analysis can apply to a number of other circumstances in which alkali metal compounds are employed for synthesis of $TiO_2$ nanowires, such as the hydrothermal synthesis techniques.

Ti foil experiments using KCl (both crystal and solution forms) resulted in nanowires but those using HCl did not. This experiment showed that Cl was not important for nanowire formation similar to that presented in reference for thermal oxidation [21]. No nanowires were obtained on Ti foil with only Ti powder on it without any KCl added. Further, nanowires were obtained with KOH crystals illustrating that K indeed is responsible for nanowire growth. nanowires were also obtained when using NaCl, NaOH and LiCl crystals too, thereby further confirming the generic role of alkali metals (Li, Na, K etc.) for nanowire growth. Results from the experiments using different reagents are summarized in FIG. 5. The experiment using a Ti foil with only half of the foil covered by KCl resulted in nanowires on the part covered with KCl, suggesting that the vapor form of K (or its transport) is not responsible for the nanowire growth.

Figure 5A:
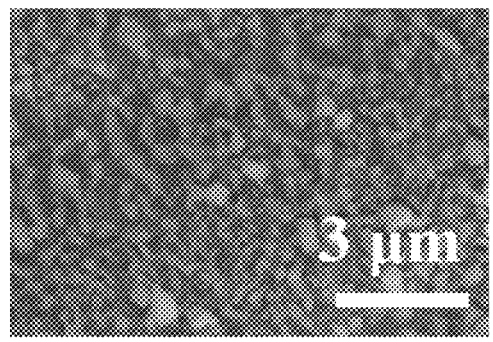
FIGS. 5A-5F are SEM images showing the effect of hydrochloric acid (HCl.
Figure 5B:
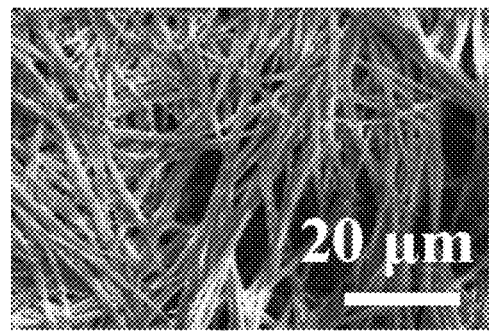
Figure 5C:
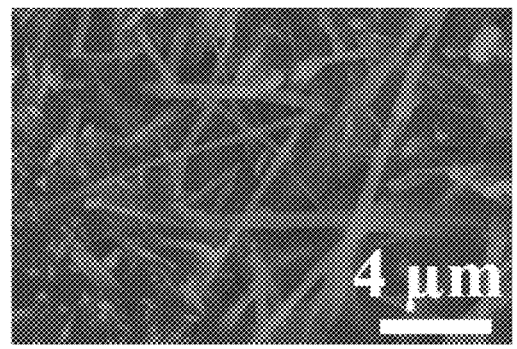
Figure 5D:
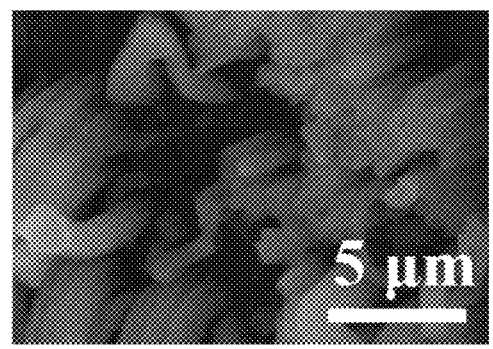
Figure 5E:
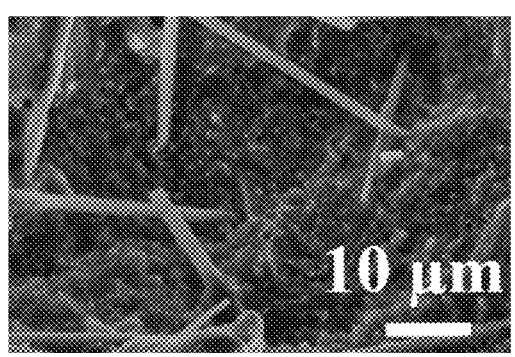
Figure 5F:
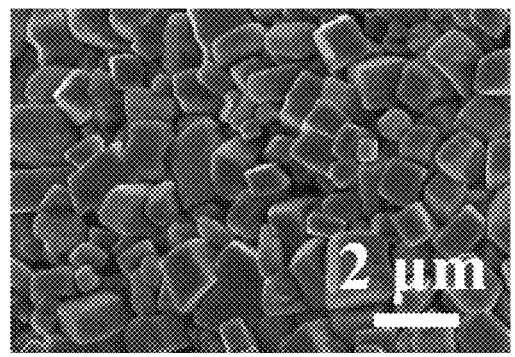
Figure 6A:
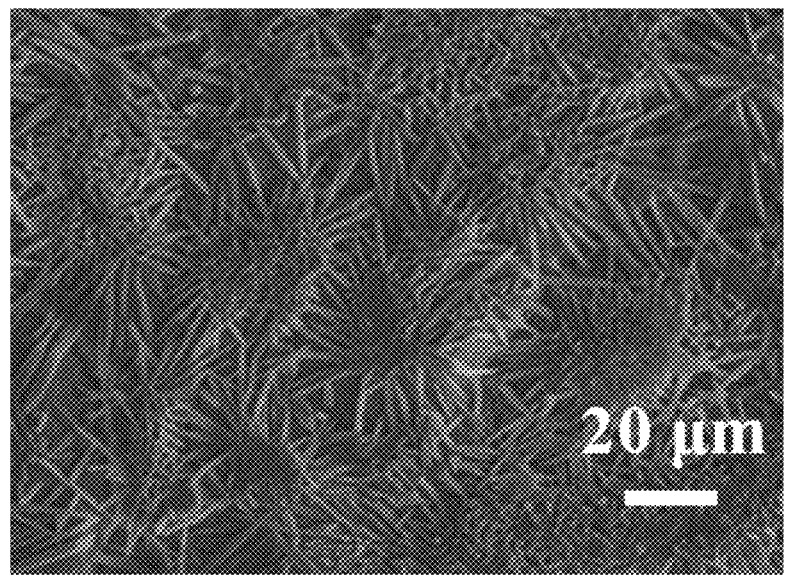
FIGS. 6A-6B are SEM images showing nanowires growing out from a molten metal pool on Ti foil (FIG. 6A) and a nanowire emanating from the molten melt (FIG. 6B)
Figure 6B:
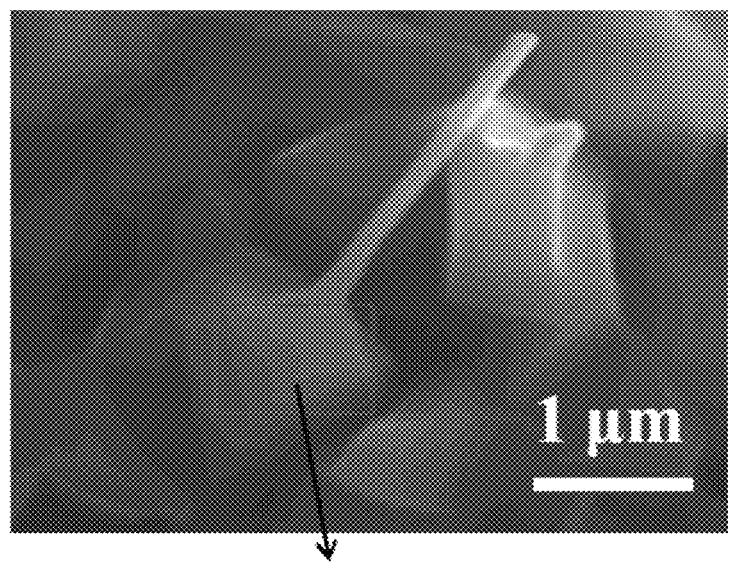

In addition to the high density of nucleation and growth from large size, spherical Ti metal particles, the results with oxidation of Ti foils also indicate high density of nanowires from hemi-spherical islands. As the islands become closely spaced, the resulting nanowires grow vertically due to spatial confinement leading to vertical arrays as shown in FIG. 6A. These observations are similar to those observed when performing plasma oxidation of low-melting metal particles supported on substrates [13], which indicate that the nucleation and one-dimensional growth occurs with nucleation out of a molten phase. Based on all of these experimental observations (e.g., results in FIGS. 5 and 6) and prior work with nanowire nucleation and growth from molten phases [13, 14, 31], it was believed that the titanate nanowire formation follows four steps as shown in FIG. 7: (1) formation and availability of alkali metal from its salt; (2) alloying of molten metal with Ti or $TiO_2$ to form Ti-alkali metal-O alloy which lowers the melting point of Ti due to eutectic formation, (3) continuous dissolution of Ti from below leading to phase segregation and bulk nucleation, and (4) basal growth of nuclei into nanowires from dissolved species leading to one-dimensional growth. In terms of specific experiments using KCl, under plasma exposure, KCl melts (at 775° C.) and spreads on the surface as a thin grey film. K vapor or melt can easily be oxidized to form $K_2O$ which either decomposes at the synthesis temperatures (approximately 450° C. is the decomposition temperature) or quickly alloys with Ti species. The availability of active K may be necessary for the growth of nanowires. The molten K quickly alloys with Ti and O and starts dissolving underlying Ti by lowering its melting point due to eutectic formation. Further alloying of Ti in K—Ti—O melt leads to super saturation and bulk nucleation of potassium titanate nuclei out of the molten phase. Data on K—Ti—O phase diagram is scarce; however, from one report $K_2Ti_8O_{17}$ phase is predicted to nucleate at temperatures greater than 1200° C. and Ti/K ratio in the excess of 20 [29]. The predicted temperature may not be accurate as lower synthesis temperatures have been reported [24]. In the present case, the nanowire synthesis temperature at the surface of the foil can be as high as 1000° C. due to plasma gas temperatures. An approximate calculation on the critical nucleus size of titanate phase using classical nucleation theory for solute precipitation from dissolved solution [14] predicts to be in the tens of nm range which matches with the experimental observations. K—Ti phase diagram available in literature shows very low solubility (less than 0.0003 at %) for Ti in K [32]. Even for K—Ti—O system, the same can be applied to conclude that the solubility would be very less between K-rich melt and Ti-rich titanate phase. The contact angle between solid titanate phase nuclei and K-rich melt is approximately calculated to be 120° (non-wetting contact angle) based on the Neumann approach [33], and using average surface energy values of 83.4 $mJ/m^2$ and 174 $mJ/m^2$ for titanate [34] and K-rich melt [35] respectively, which confirms the poor wettability. Thus, poor miscibility and wettability ensures that the further dissolution of Ti in Ti—K—O melt leads to one-dimensional nanowire growth perpendicular to the molten surface and not the lateral crust formation. Also, the growth occurs predominantly from the underlying Ti foil/powder (as shown in FIG. 6B) and not from $TiO_2$ in vapor phase because the growing nanowires are still attached to their molten base. Another thing to note is that the titanate nucleation and subsequent nanowire growth is not uniform throughout the foil but occurs locally at the areas (on the foil) selectively wetted by the melt. Also, in the case of large Ti metal particle size (65 μm) alkali metal dissolution and alloy formation only occurs to a depth of few microns from the Ti surface with underlying sphere core intact. But, in the case of smaller size (32 nm) $TiO_2$ powders complete consumption of sphere is observed. The growth mechanism is schematically represented for oxidation of foils and powders in FIG. 7.

To further examine nanowire formation using the above-described techniques, the ease of nanowire formation using chlorides of alkali metals (Li, Na and K) was compared in light of their respective melting points of alkali metals, oxide decomposition temperatures, and their ionic radii. Table 1 lists these parameters and shows that nanowire formation time follows the pattern: K<Li<Na. It appears that the KCl assisted nanowire formation is easiest and fastest because of the low melting point of K, as compared to Li and Na, and also because its respective oxide decomposes very easily. Between Li and Na based nanowire formation time, the former seems to be somewhat easier because of its smaller and comparable ionic radii ($Ti^{4+}$=61 pm, when Z=6), though both of them have similar oxide decomposition temperatures. It should also be noted that chlorides of all these alkali metals have melting points in the range of 605-801° C. which is well below the synthesis temperature (approximately 1000-1500° C.).

TABLE 1

Comparison of parameters affecting the $TiO_2$ nanowire formation in different alkali metal assisted plasma exposure experiments.

| Nanowire Formation time | KCl: 5 mins | NaCl: 13 mins | LiCl: 8 mins |
|---|---|---|---|
| Oxide Decomposition Temperature | $K_2O$: 450° C. | $Na_2O$: ~1000° C. | $Li_2O$: ~1350° C. |
| Melting Point (° C.) | K: 63 | Na: 98 | Li: 180 |
| Ionic Radii (pm): Z = 6 | $K^+$: 138 | $Na^+$: 102 | $Li^+$: 74 |

Group II elements were also tested as reagents for $TiO_2$ nanowire formation on Ti foil. However, no nanowires were seen when $CaCl_2$ was used instead of KCl under similar conditions. In this case, laterally grown crystals were seen on Ti metal surface (FIG. 5F). This behavior can be explained by the reasons opposite to KCl case. $CaCl_2$ melts (at 772° C.) to form CaO in atmospheric plasma. CaO doesn't decompose at the synthesis temperatures (approximately 1500° C.) and along with Ti results in the formation of three-phase region with different Ti—Ca—O compounds [36]. Ca, unlike K, is not a low melting metal (839 vs. 63° C.). Although the growth mechanism in hydrothermal method is not clear, it was thought that Ca follows the same mechanism as proposed above and hence the presently-disclosed method can be applicable to other nanowire systems that have been synthesized using hydrothermal methods to date.

Discussion of Examples 1-2

Titanate nanowires resulted using atmospheric plasma exposure of either Ti or $TiO_2$ powders or foils in the presence of various alkali metal salts. The synthesis time scale is very fast and this method is suitable for large scale production of nanowires. The one-dimensional growth occurs with bulk nucleation and basal growth of nuclei from molten alloys of alkali metal-Ti—O similar to that of direct oxidation of low-melting metals for respective metal oxide nanowires. In the experiments specifically using KCl, the as-synthesized potassium titanate ($K_2Ti_8O_{17}$) nanowires were obtained. A procedure of ion exchange with HCl followed by annealing converted potassium titanate nanowires to rutile phase $TiO_2$ nanowires. Plasma annealing was also shown to reduce the time scales to minutes compared to hours required for thermal annealing step.

Example 3

Solvo-plasma Oxidation Method for Scalable Manufacturing of Metal Oxide Nanowires To determine whether the above-described methods for synthesizing TiO2 nanowires were capable of being applied to other metal oxide systems, experiments were conducted using tungsten, cobalt, and manganese metals in addition to titania. Briefly, the custom designed microwave, atmospheric plasma (2.45 GHz) discharge reactor was again used to perform the foil exposure experiments. The atmospheric plasma discharge using air flow and microwave powers ranging from 500 W to 3 kW was shaped vertically as shown in FIG. 1. Further details on the atmospheric plasma discharge and its shaping either vertically or downward can be found elsewhere [22,23]. In a typical plasma oxidation experiment, the desired metal or metal oxide powder mixed with alkali reagent was placed on a 1 cm×1 cm foil piece and was then exposed to upward plasma discharge at 700-900 W with 12 lpm air for about 2 min. The as-synthesized products were analyzed using a field emission scanning electron microscope (FE-SEM; FEI Nova 600), an X-ray diffraction (XRD; Bruker D8 Discover), a Renishaw in-via micro-Raman/photoluminescence spectroscope, and a transmission electron microscope (TEM; Tecnai F20 FEI TEM with a GATAN 2002 GIF system).

Figure 9A:
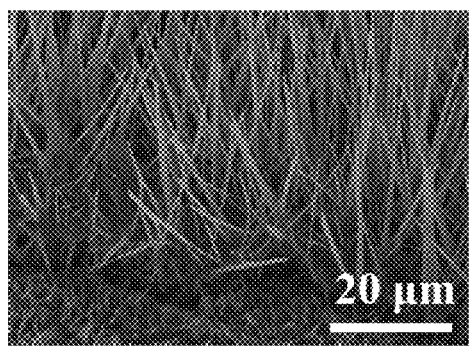
FIGS. 9A-9D are SEM images of as-synthesized titanate nanowires (FIG. 9A), cobalt oxide nanowires (FIG. 9B), manganese oxide nanowires (FIG. 9C), and tungsten oxide nanowires (FIG. 9D), where the nanowires were synthesized by combining the respective raw powders of the transition metals with KCl, supporting the mixture on foil, and subsequently exposing the mixture to an atmospheric microwave plasma discharge at 900 W for 2 to 3 minutes.

The plasma oxidation experiments using titanium, cobalt, manganese and tungsten mixed with alkali compounds, such as KCl, for complete conversion of spherical particles into nanowires are summarized in Table 2. In the case of titania, high densities of alkali titanate nanowires resulted when $TiO_2$ powder mixed with KCl was supported on either Ti or Graphite foil and was exposed to microwave plasma discharge for 2 min. Use of Ti foil with KCl resulted in a vertical array of nanowires directly over the Ti foil as shown in FIG. 9A. In experiments involving titanium metal, the diameter of the resulting nanowires ranged from 50-500 nm and lengths from 5-30 μm. The resulting titanate nanowires were converted to $TiO_2$ nanowires with ion exchange using a dip in 1 M HCl for 1 hr followed by annealing with plasma exposure for 5 min as described herein above. The plasma oxidation for annealing reduced the time scales required in the case of thermal annealing from hours to minutes.

TABLE 2

Summary of the experimental conditions used for the nanowire production.

| System | Raw powder used | Foil used | Alkali reagent | Experimental condition | Results |
|---|---|---|---|---|---|
| Ti | $TiO_2$, anatase | Ti or Graphite | KCl | 12 lpm air, 800-900 W, 2-3 min | Titanate nanowire array |
| Co | $Co_3O_4$, <50 nm | Co | KCl | Same as above | Long bent nanowires |
| Mn | Mn, <10 μm | Graphite | KCl | Same as above | Long, beaded and bent nanowires |
| W | W, ~1 μm | Graphite | KCl | Same as above | Straight cylindrical rod |

Figure 9B:
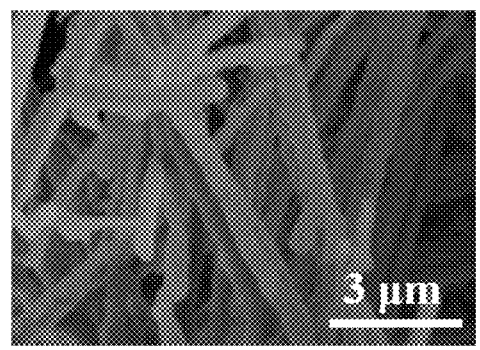
Figure 9C:
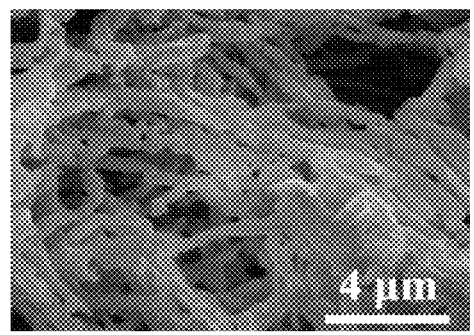
Figure 9D:
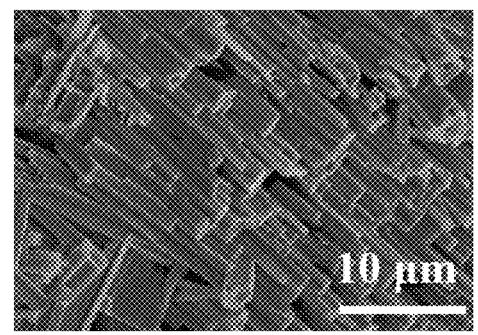

In the case of cobalt, manganese and tungsten, the respective oxide nanowires resulted without going through any alkali compound phase. Cobalt oxide nanowires resulted when $Co_3O_4$ powder placed on Co foil was used for plasma exposure along with KCl. These wires are about 20-30 μm long with about 300-500 nm of diameter as shown in FIG. 9B. Similarly, long, beaded and bent nanowires (500 nm diameter and approximately 10 μm length) of manganese oxide were obtained starting from spherical Mn powder (see, e.g., FIG. 9C). However, straight cylindrical nanowires were synthesized upon plasma exposure of W powder (500 nm diameter and ~10 μm length) as shown in FIG. 9D. The hexagonal facets seen in SEM images of these nanowires suggest that they might have hexagonal structures as rightly revealed by XRD and Raman spectroscopy.

Figure 10A:
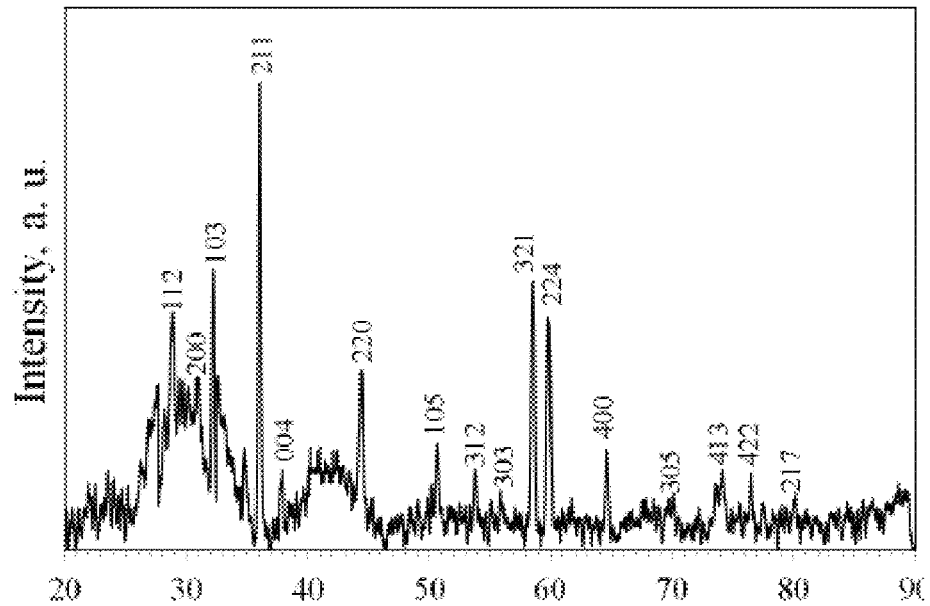
FIGS. 10A-10D are X-ray diffraction (XRD) spectra of as-synthesized $Mn_3O_4$ nanowires (FIG. 10A; lattice constants of a=b=5.762 Å and c=9.469 Å, JCPDS #24-0734); $Co_3O_4$ nanowires (FIG. 10B; lattice constants of a=b=c=8.04 Å, JCPDS #71-4921); $TiO_2$ nanowires (FIG. 10C; lattice constants of a=b=4.593 Å and c=2.959 Å, JCPDS #65-0191); and $WO_3$ nanowires (FIG. 10D; lattice constants of a=7.298 Å and c=3.899 Å, JCPDS #33-1387), where the presence of other signals from the substrate is shown by an asterisk (*).
Figure 10B:
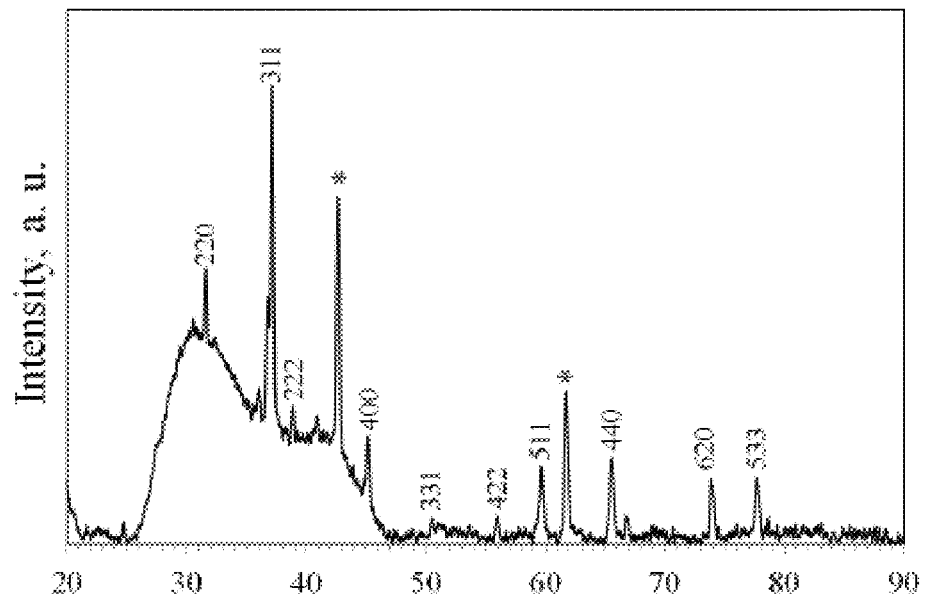
Figure 10C:
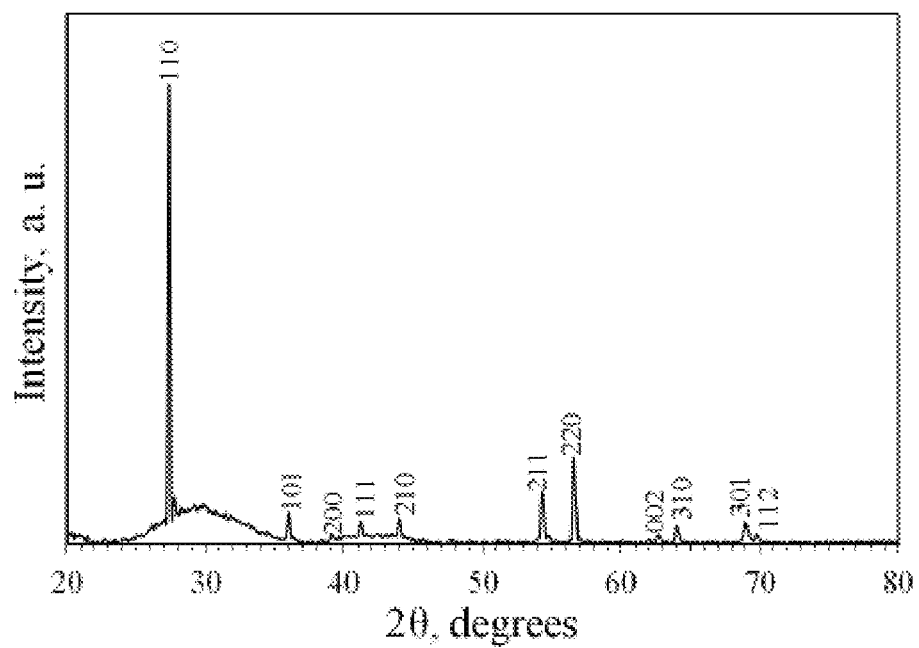
Figure 10D:
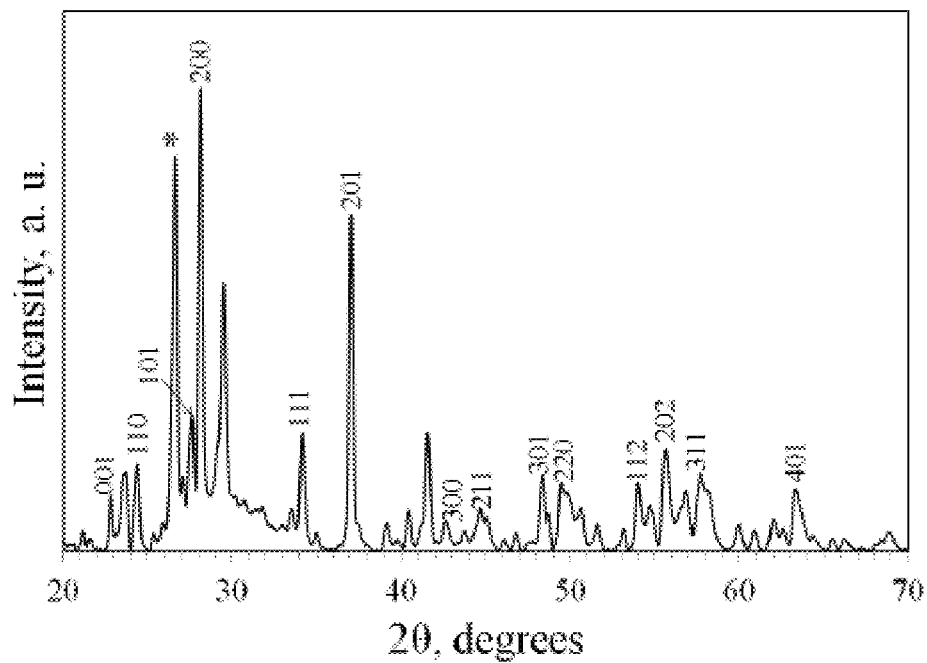
Figure 11:
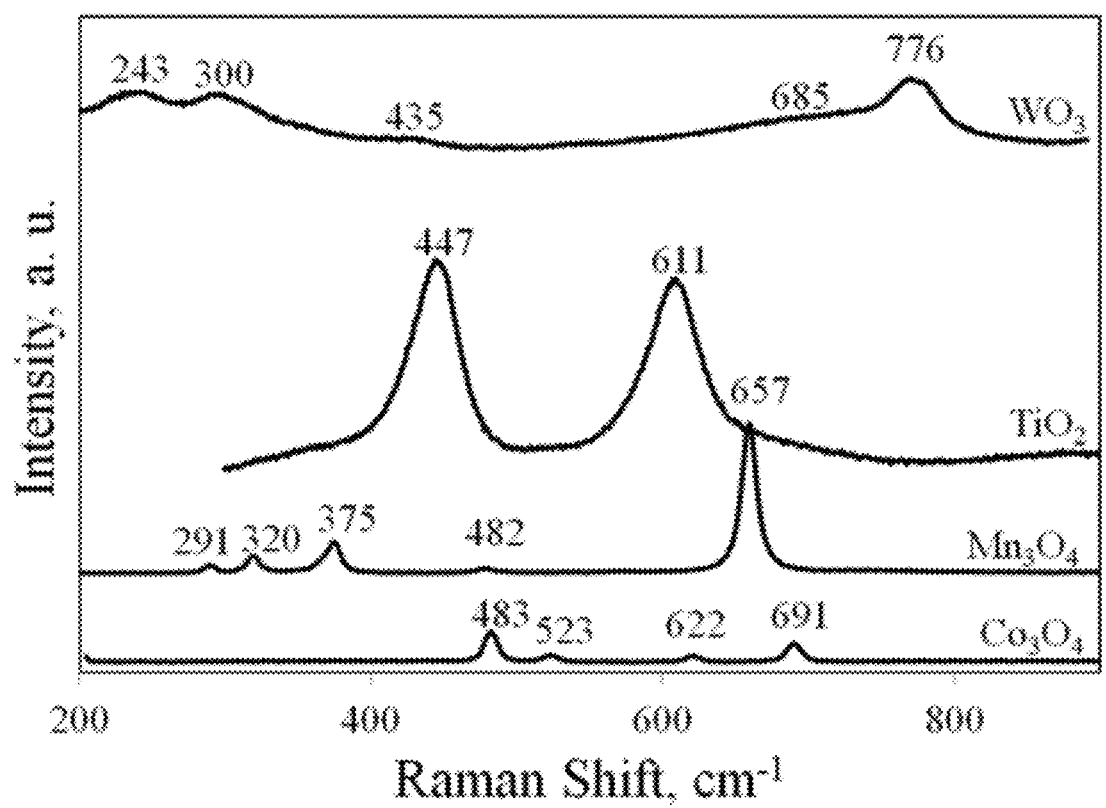
FIG. 11 is a graph of the Raman spectra of nanowires of $Co_3O_4$, $Mn_3O_4$, $TiO_2$, and $WO_3$. The peaks correspond to FCC $Co_3O_4$, hausmannite $Mn_3O_4$, rutile $TiO_2$ and hexagonal $WO_3$.

XRD and Raman was further used to characterize the phase and crystal structure of the nanowires. FIGS. 10A-D and 11 show the typical diffraction pattern and Raman spectra of these samples. In the case of manganese oxide, all the diffraction peaks in FIG. 10A can be indexed to hausmannite $Mn_3O_4$ with tetragonal structure. This is also confirmed from Raman spectrum for $Mn_3O_4$ in FIG. 11, where all the peaks are in good agreements with previously reported results for $Mn_3O_4$ [34,35]. XRD spectrum of cobalt oxide (FIG. 10B) indicated the presence of two phases of cobalt oxide: $Co_3O_4$ from the as-synthesized nanowires and CoO from the Co foil. $Co_3O_4$ phase can be indexed to face centered cubic structure. Raman spectroscopy of cobalt oxide in FIG. 11 specifically on nanowire powders shows peaks at 483, 523, 622 and 691 $cm^{-1}$ corresponding to the $E_g$, $F^1_{2g}$, $F^2_{2g}$ and $A_{1g}$ modes of the crystalline $Co_3O_4$ respectively and also matches to those previously reported [64-66]. XRD from cobalt oxide powder synthesized by placing it on graphite foil did not show any CoO peaks which shows that it is only due to the Co foil. Also, energy-dispersive X-ray spectroscopy (EDX) showed the elemental composition corresponding to CoO on the bare surface and $Co_3O_4$ on the nanowire powder which confirms that the phase of the powder is $Co_3O_4$. XRD investigation on the ion exchanged and annealed titanate sample revealed the phase of the nanowires to be rutile tetragonal $TiO_2$ as shown in FIG. 10C. Raman spectrum in FIG. 11 for $TiO_2$ also confirmed the rutile structure showing peaks at 447 and 611 $cm^{-1}$. XRD pattern of tungsten oxide sample (FIG. 10D) synthesized on graphite foil can be indexed to the $WO_3$ hexagonal phase. All the peaks from a typical $WO_3$ hexagonal spectrum could be indexed while a peak from graphite substrate was also seen and other peaks might be from impurities or other phases of tungsten oxide in the sample. Raman spectrum of the as-synthesized $WO_3$ nanowire shown in FIG. 11 resulted in peaks centered at 243, 300, 435, 685 and 776 $cm^{-1}$. Peaks at 243 and 300 are assigned to the W—O—W bending mode, and the peaks at 685 and 776 are attributed to the stretching modes of O—W—O [67]. The broadened band at 435 $cm^{-1}$ can be due to the characteristic band of crystalline $WO_3$ [68]. Surprisingly, hexagonal $WO_3$ has been synthesized mostly from hydrothermal or wet-synthesis techniques [67, 69] whereas monoclinic structures have been synthesized by chemical vapor deposition methods [59, 70, 71].

Figure 12A:
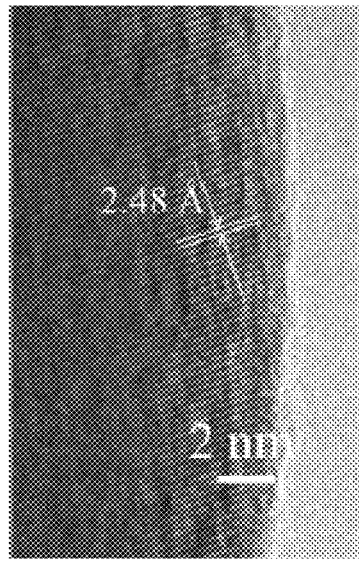
FIGS. 12A-12D are HRTEM images of $Mn_3O_4$ (FIG. 12A), $WO_3$ (FIG. 12B), $K_2Ti_8O_{17}$ (FIG. 12C), and $TiO_2$ (FIG. 12D) nanowires.
Figure 12B:
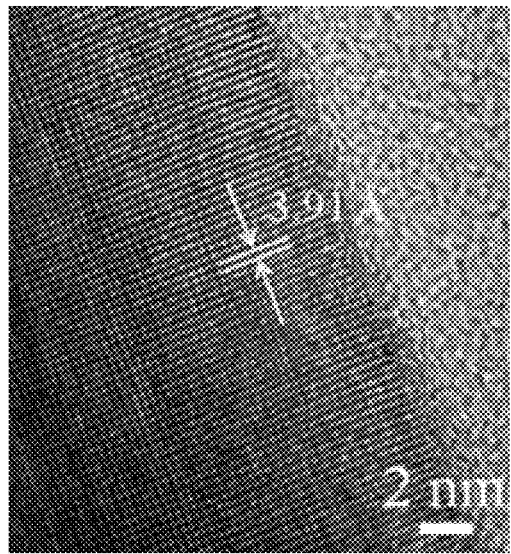
Figure 12C:
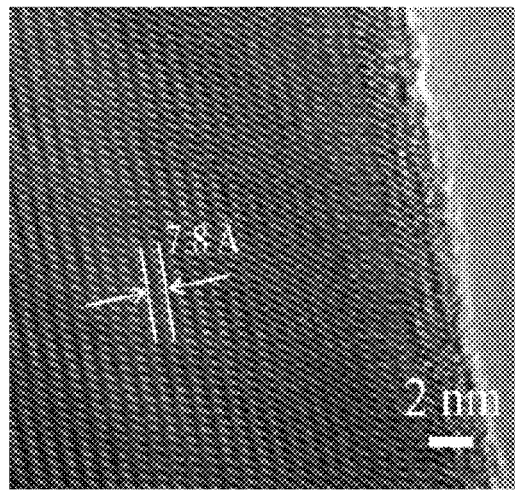
Figure 12D:
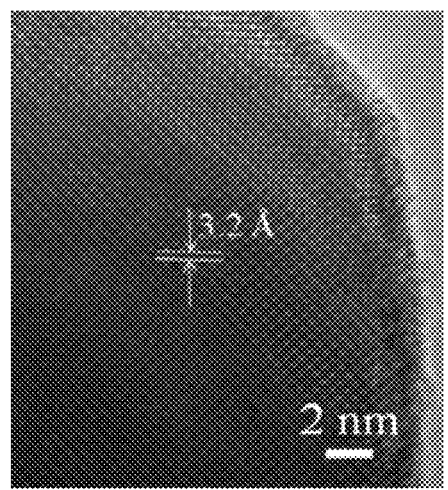

High-resolution TEM (HRTEM) images of $Mn_3O_4$, $WO_3$, potassium titanate and $TiO_2$ nanowires are shown in FIGS. 12A-12D. The $Co_3O_4$ nanowire was not imaged because of the magnetic nature of the sample and possible interference with TEM magnetic field. The HRTEM analysis suggests that the nanowires are single crystalline and do not contain any amorphous oxide sheath. Potassium titanate nanowires were determined to be of formula $K_2Ti_8O_{17}$. In the case of $Mn_3O_4$ (FIG. 12A), the measured lattice fringe distances of 2.48 Å between (211) planes are consistent with d-spacing of (211) planes of $Mn_3O_4$ XRD spectrum and also other reports [72]. Similarly, the measured fringe spacing of 3.91 Å correspond to the (001) lattice spacing of hexagonal $WO_3$ as shown in FIG. 12B. Alkali titanates are known to have large interplanar spacings with a tunnel like structure which allows for easy mobility of ions during ion exchange. In the case of $K_2Ti_8O_{17}$ nanowires (FIG. 12C), interplanar spacing of 7.8 Å of (200) planes matches with the reported values of $d_{200}$ for $K_2Ti_8O_{17}$ [78, 79]. FIG. 12D shows the fringe spacing of 3.2 Å in (110) planes of rutile $TiO_2$ which is consistent with the d-spacing of (110) planes.

As the foregoing results indicate, the technique of using plasma oxidation of metals mixed with alkali compounds is capable of producing the respective oxide nanowires. Table 3 compares the primary reactions responsible in hydrothermal oxidation techniques with those from the proposed solvo-plasma oxidation technique in this work. It can be seen that hydrothermal reactions is $H_2O$-mediated whereas solvo-plasma reaction is O-mediated, where KCl provides the solvent medium and O from plasma acts as the oxidant. Also, in the case of $Co_3O_4$, $WO_3$ and $Mn_3O_4$ nanowires, the hydrothermal reactions proceed in two steps where the desired product is obtained from an intermediate product upon thermal annealing for few hrs. The reactions in the case of plasma oxidation of $TiO_2$ are discussed herein above. In the present case, the reactions to obtain nanowires are direct and there is no need for any intermediate or thermal annealing. Also, the kinetics of the process is rapid, i.e., the reaction time scales are on the order of tens of seconds to minutes compared to several hrs in hydrothermal or solvo-thermal techniques. The fast kinetics of the process can be understood through O and OH radical mediation compared to $H_2O$ mediation for oxidation. Here, $Cl_2$ is expunged in the gaseous form and $K_2O$ decomposes above 450° C. after the precursors material is consumed as discussed below. In the solvo-plasma reactions in Table 3, O can also be replaced with a combination of $O^+$+e or $O^{2+}$+2e and KCl with a combination of $K^+$+$Cl^-$ or $K^+$+Cl+e which can make these reactions more spontaneous and favorable by 1286, 789, 460, 759 kJ/mol respectively based on ΔG calculations at 1200 K. Also, this solvo-plasma oxidation scheme is faster than the gas phase thermal oxidation reactions (few hrs) used for nanowire synthesis in some cases. Without wishing to be bound by any particular theory, it is believed that the reason is that, in thermal oxidation gas molecules need to stick, accommodate and adsorb on the surface, dissociate (where dissociation depends strongly on surface temperature) and then react which makes this whole process inefficient compared to plasmas (which already have dissociated species that can directly interact with surfaces without any inter stages).

charge suggest the formation of lithium silicate tubes. The resulting nanowires of $TiO_2$, $Mn_3O_4$, $Co_3O_4$ and $WO_3$ were determined to be rutile, tetragonal hausmannite, cubic fcc and hexagonal phases, respectively. Bulk nucleation and basal growth from molten phase is suggested as the mechanism responsible for the one-dimensional growth that was observed.

TABLE 3

Comparison of the hydrothermal and the solvo-plasma oxidation reactions leading to the formation of the nanowires in the case of Ti, Co, Mn and W material systems.

| System | Hydrothermal reaction reported | Proposed, solvo-plasma oxidation reaction |
|---|---|---|
| Ti | $8TiO_2$ (s) + 2KOH (l) + $15H_2O$ → $K_2Ti_8O_{17}$ (s) + $16H_2$ + $8O_2$ | $8TiO_2$ (s) + 2KCl (l) + O → $K_2Ti_8O_{17}$ (s) + $Cl_2$ |
| Co | $Co(NO_3)_2$ + $2NH_4OH$ (aq) → $Co(OH)_2$ + $2NH_4NO_3$<br>$6Co(OH)_2$ + $O_2$ → $2Co_3O_4$ + $6H_2O$<br>[from Reference 74] | $Co_3O_4$ + 2KCl (l) + O → $Co_3O_4$ (s) + $Cl_2$ + $K_2O$ |
| Mn | $2MnO_4^-$ + $3Mn^{2+}$ + $2H_2O$ → $5MnO_2$ + $4H^+$<br>$MnO_2$ + $H_2O$ → MnOOH → $Mn_3O_4$<br>[from Reference 75] | 3Mn + 2KCl (l) + 5O → $Mn_3O_4$ + $Cl_2$ + $K_2O$ |
| W | $Na_2WO_4$ + 2HCl + $nH_2O$ → $H_2WO_4 \cdot nH_2O$ + 2NaCl<br>$H_2WO_4 \cdot nH_2O$ → $WO_3$ + $(n + 1)H_2O$<br>[from Reference 76] | W(s) + 2KCl (l) + 4O → $WO_3$ (s) + $Cl_2$ + $K_2O$ |

Based on the previously-described results with the low-melting metals [13] and the above-described results with $TiO_2$ nanowires with KCl, it is believed that a molten-salt assisted growth mechanism is present in this case. Unlike liquid phase methods [49], there are no surfactants in the present experiments, indicating that the alkali metals are forming molten alloys with the metal oxide powders used. At the synthesis temperatures employed in the present experiments (approximately 800-1000° C.), KCl can melt and alloy with the precursors and also provide a suitable medium for enhanced mobility of the species in the flux. The metal oxides dissolve into molten salts and represent a molten phase during oxidation. The nucleation out of the molten phase can lead to high density of nuclei on their surface. Further growth of nuclei can only occur with metal oxide species from the molten phase below leading to basal growth of nuclei toward one-dimensional structures. The temperature and phase diagram determine the composition of the resulting phase from the molten phase during oxidation. Data on alkali metal-Mn/Co or W phase is non-existent and it can be assumed that pure $Co_3O_4$ or $Mn_3O_4$ or $WO_3$ phases segregate out, which upon further dissolution results in the growth of the nanowires.

Here, the majority of the results are demonstrated using only one type of alkali salt (KCl), but other alkali metal compound such as LiOH, LiCl, NaCl, NaOH or KOH can also be utilized. For example, lithium silicate nanotubes of diameter less than 100 nm and lengths on the order of several microns in length were also synthesized when LiOH was used with Si powder and exposed to plasma discharge under similar conditions. Similarly, nanowires of other transition metal oxides could also be synthesized using the same conditions. Direct and ultra-fast conversion (within minutes) of spherical metal or metal oxide powders to nanowire powder directly over the desired substrate could make this synthesis method suitable for large scale industrial production.

In summary, a solvo-plasma oxidation method was found to allow for ultrafast production of various metal oxide nanowires and nanotubes. In this technique, the respective metals or metal oxide powders are dissolved in alkali salts and oxidized using atmospheric plasma discharges. nanowires of $TiO_2$, $Mn_3O_4$, $Co_3O_4$, and $WO_3$ have been synthesized directly from spherical powder within minutes using a novel solvo-plasma oxidation concept. Experiments using lithium salts and silicon oxidized using atmospheric plasma dis- Example 4

Figure 13A:
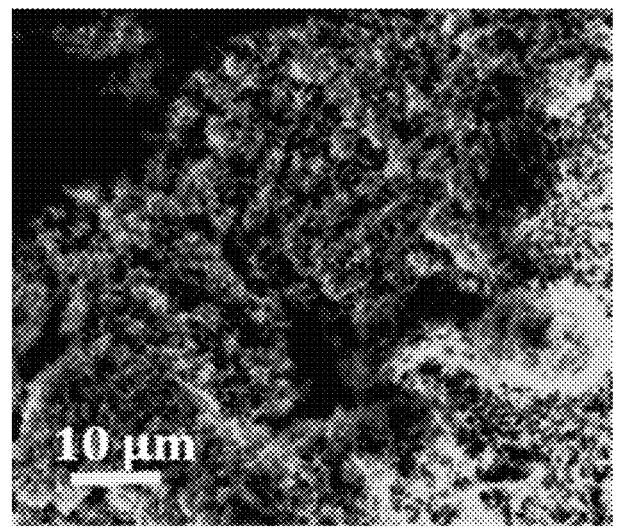
FIGS. 13A-13B are SEM images of raw titania powders (FIG. 13A) and as-synthesized potassium titanate nanowire powders (FIG. 13B).
Figure 13B:
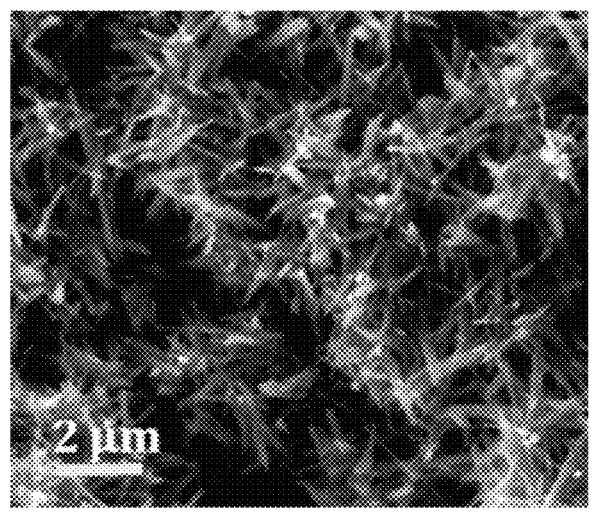

Synthesis of Nanowires in Powder Form Using Titania Powders as Raw Material Mixed with a Potassium Source and Supported on an Inert Substrate Using techniques similar to those described herein above, nanowires in powder form were synthesized using titania powders (FIG. 13A) as a raw material where the titania powders were mixed with a potassium source and were supported on an inert substrate. This synthesis procedure employed a plasma discharge having a power of 750 W and a gas composition of 10 lpm air, 100 sccm $H_2$. The reaction time for the synthesis procedure was 1 min, although it was further observed that is was possible to use a power of 500-1000 W by adjusting $O_2$ percentage (higher power=lower $O_2$ percentage in reacting gas composition) and time (lower power=longer time). Upon completion of the procedure, SEM images showed the resulting potassium titanate nanowire powder (FIG. 13B) had an average diameter of 20 to 40 nm and an average length of 5 to 10 μm. X-ray diffraction (XRD) analysis further showed the resulting nanowire powders to be potassium titanate nanowires.

In these conjunction with this synthesis procedure, the ability to easily remove excess salt from nanowires using a quick solvent rinsing step was also demonstrated, along with the ability to spray titania coated foils with a KCl solution to synthesize nanowires, and the ability to bubble reactive gases through a KCl solution to synthesize nanowires.

Example 5

Figure 14C:
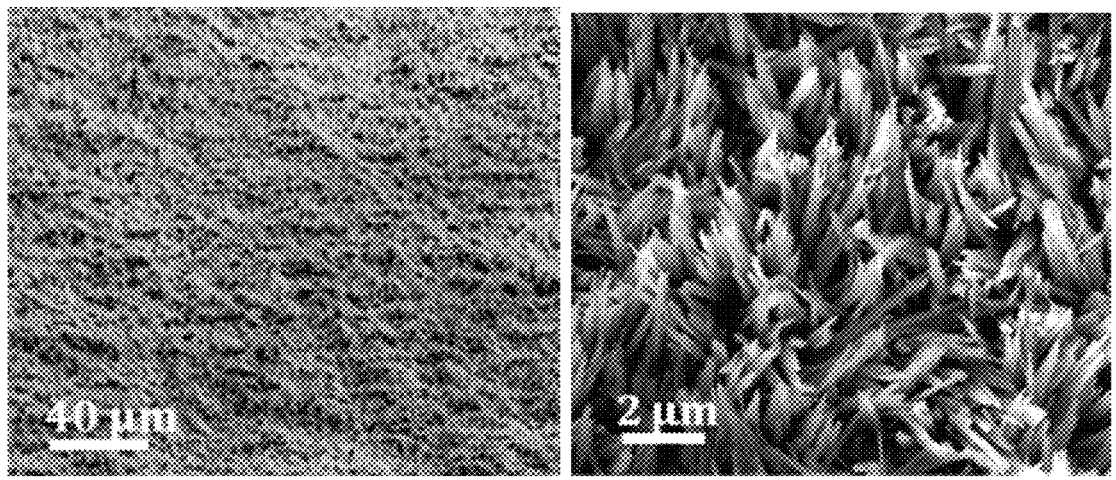
Figure 14C:
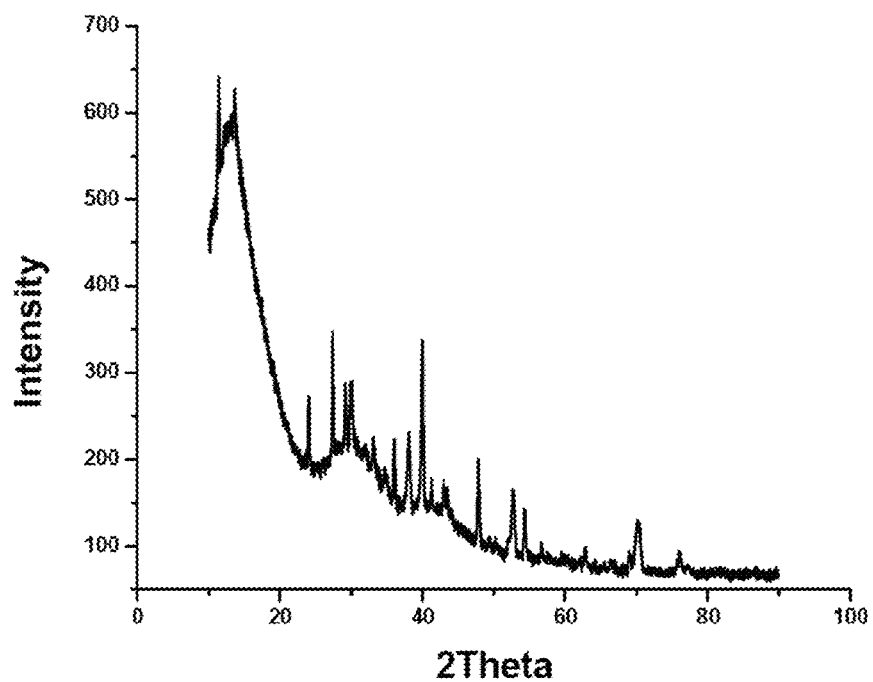

Synthesis of Nanowires in Powder Form Using Potassium Titanate Powders as Raw Material Supported on an Inert Substrate Using techniques similar to those described herein above, nanowires in powder form were synthesized using potassium titanate powders (FIG. 14A) as a raw material where the titanate powders were supported on various inert substrates, including titanium, stainless steel, aluminum, and graphite supporting foils having varying thicknesses. These synthesis procedures employed an atmospheric plasma discharge having a power of 750 W atmospheric plasma and a gas composition of 10 lpm air. The reaction time with those conditions was 30 seconds, but it was further observed that is was possible to use a power of 500 to 1000 W by adjusting the $O_2$ percentage (higher power=lower $O_2$ percentage in reacting gas composition) and time (lower power=longer time). Upon completion of the procedure, SEM images showed the resulting potassium titanate nanowire powder (FIG. 14B) had a higher percentage of conversion then with $TiO_2$, an average diameter of 70 to 100 nm, and an average length of 20 to 30 µm. XRD analysis further revealed a $K_2Ti_6O_{13}$ monoclinic phase (FIG. 14C). In these experiments, it was further demonstrated that nanowire synthesis was more rapid and occurred with higher conversion on thinner foils which was though to be due to a reduced heat sinking effect of thin foils as compared to thick foils.

Example 6

Figure 15A:
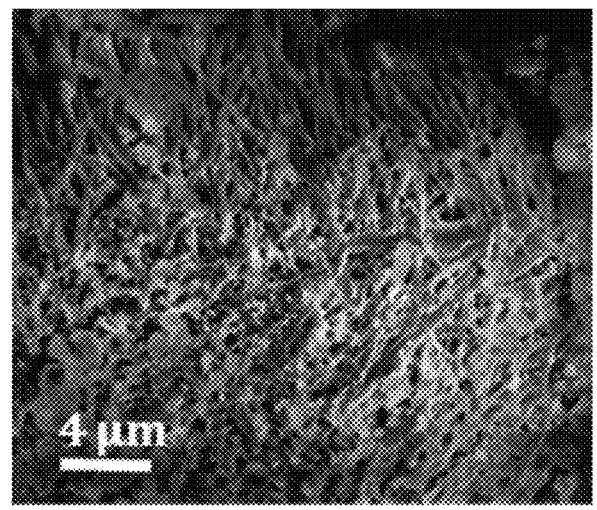
FIGS. 15A-15B are SEM images of raw potassium titanate powder (FIG. 15A) and potassium titanate nanowire powders (FIG. 15B), where the potassium titanate nanowire powders were synthesized from the raw potassium titanate powder directly in the gas phase.
Figure 15B:
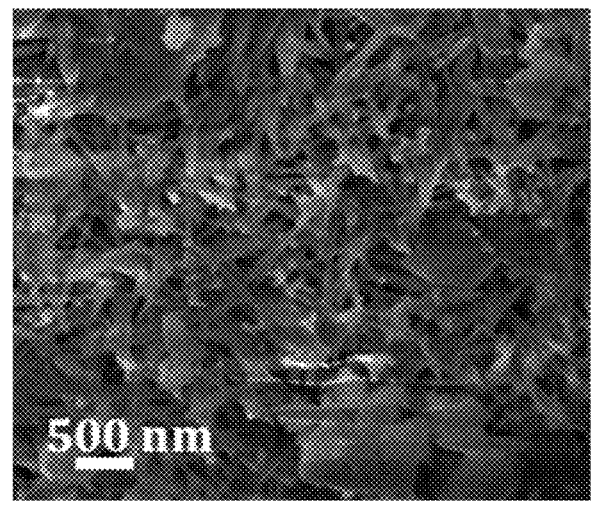

Synthesis of Nanowires in Powder Form Using Potassium Titanate Powders as Raw Material Directly in the Gas Phase Using techniques similar to those described herein above, nanowires in powder form were also synthesized by pouring potassium titanate powders (FIG. 15A) into the top of the atmospheric plasma reactor, where the powder was turned into nanowire powder after reaction in the gas phase. These synthesis procedures employed an atmospheric plasma discharge having a power of 1200 W and a gas composition of 2.25 lpm $O_2$ and 12.75 lpm $N_2$. Upon completion of the procedures, SEM images showed the resulting potassium titanate nanowire powders (FIG. 15B) had an average diameter of 70 to 90 nm and an average length of less than 5 µm. XRD analysis further confirmed that nanowires synthesized were potassium titanate nanowires.

Example 7

Figure 16A:
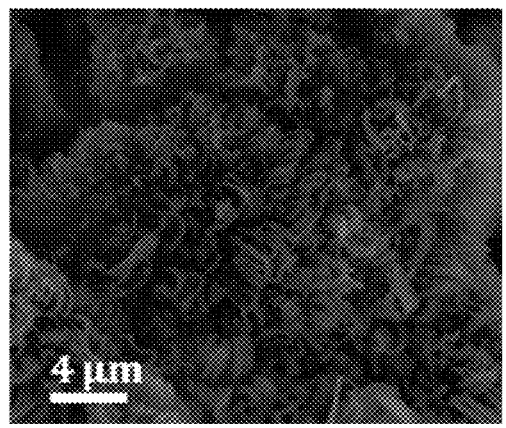
FIGS. 16A-16C include SEM images of lithium titanate commercial powders (FIG. 16A) and as-synthesized lithium titanate nanowire powders (FIG. 16B), as well as an XRD spectra of the as-synthesized lithium titanate nanowire powders (FIG. 16C).

Synthesis of Lithium Titanate Nanowires in Powder Form Using Lithium Titanate Commercial Powders as Raw Material with a Lithium Source and Supported on an Inert Substrate Using techniques similar to those described herein above, lithium titanate nanowires in powder form were also synthesized using lithium titanate commercial powders (FIG. 16A) as a raw material, where the powder was combined with a lithium source (e.g., LiOH or LiCl) and where the combination was supported on an inert substrate. These synthesis procedures employed an atmospheric plasma discharge having a power of 750 W and a gas composition of 10 lpm air. The reaction time employed was 2 minutes for that set of conditions, but it was observed that it was possible to use 400-750 W by adjusting $O_2$ percentage (higher power=lower $O_2$ percentage in reacting gas composition) and time (lower power=longer time). Further, in these experiments it was observed that maintaining cool substrate temperatures while exposing the foil to the plasma was important for the synthesis and that it was possible to use a heat sink or to increase the distance from the flame in order to synthesize nanowires using more powerful plasma discharges. Additionally, it was observed that hydrogen may not needed, but could be used to produce nanowires displaying smaller diameters.

Figure 16B:
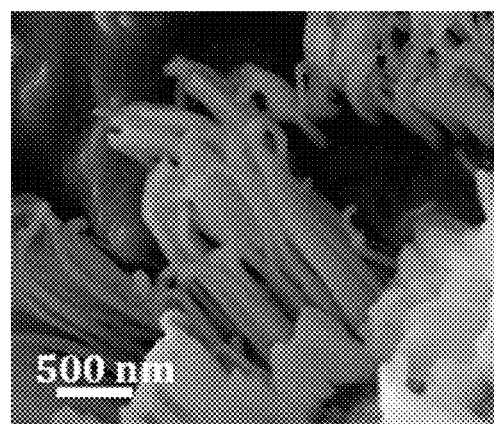
Figure 16C:
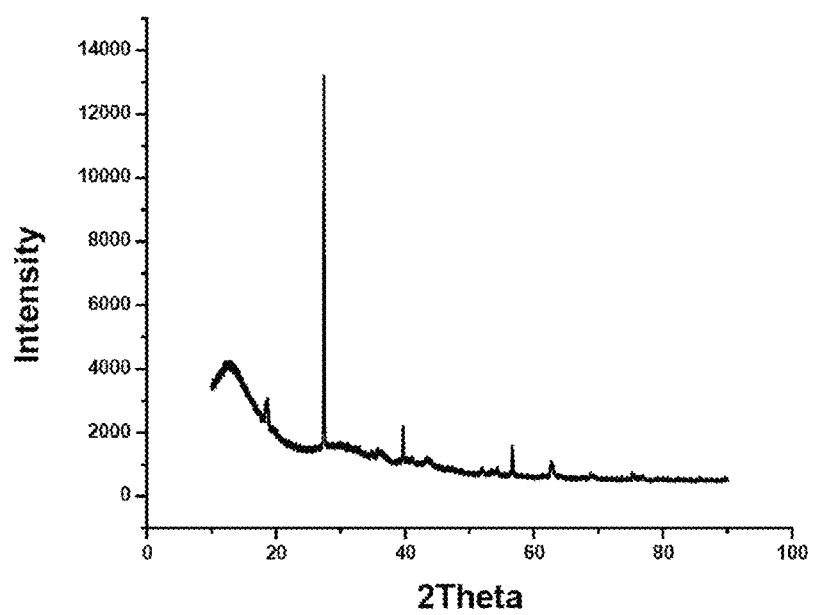

Upon completion of the procedures in this synthesis scheme, SEM images showed the resulting lithium titanate nanowire powders (FIG. 16B) had an average diameter of 60 to 80 nm and an average length of 1 to 60 µm, with most of the nanowires having a length of about 3 µm. XRD analysis further showed lithium titanate spinel phase for the nanowires (based on matching with XRD spectra for original powder (FIG. 16C).

Throughout this document, various references are mentioned. All such references are incorporated herein by reference, including the references set forth in the following list:

REFERENCES

1. Adachi, M.; Murata, Y.; Takao, J.; Jiu, J.; Sakamoto, M.; Wang, F. *J. Am. Chem. Soc.* 2004, 126, 14943.
2. Armstrong, G.; Armstrong, A. R.; Bruce, P. G.; Reale, P.; Scrosati, B. *Adv. Mater.* 2006, 18, 2597.
3. Francioso, L.; Taurino, A. M.; Forleo, A.; Siciliano, P. *Sens. Actuators B: Chem.* 2008, 130, 70.
4. Khan, S. U. M.; Sultana, T. *Solar Energy Mater. Solar Cells* 2003, 76, 211.
5. Gubbala, S.; Chakrapani, V.; Kumar, V.; Mahendra K. Sunkara *Adv. Funct. Mater.* 2008, 18, 2411.
6. Hoyer, P. *Langmuir* 1996, 12, 1411.
7. Lakshmi, B. B.; Patrissi, C. J.; Martin, C. R. *Chem. Mater.* 1997, 9, 2544.
8. Kasuga, T.; Hiramatsu, M.; Hoson, A.; Sekino, T.; Niihara, K. *Langmuir* 1998, 14, 3160.
9. Li, G. L.; Wang, G. H. *J. Mater. Res.* 1999, 14, 3346.
10. Zhang, Y. X.; Li, G. H.; Jin, Y. X.; Zhang, Y.; Zhang, J.; Zhang, L. D. *Chem. Phys. Lett.* 2002, 365, 300.
11. Liu, B.; Boercker, J. E.; Aydil, E. S. *Nanotechnology* 2008, 19, 505604.
12. Peng, X.; Chen, A. *Adv. Funct. Mater.* 2006, 16, 1355.
13. Sharma, S.; Sunkara, M. K. *J. Am. Chem. Soc.* 2002, 124, 12288.
14. Sunkara, M. K.; Sharma, S.; Miranda, R.; Lian, G.; Dickey, E. C. *Appl. Phys. Lett.* 2001, 79, 1546.
15. Mozetic, M.; Cvelbar, U.; Sunkara, M. K.; S. Vaddiraju *Adv. Mater.* 2005, 17, 2138.
16. Cvelbar, U.; Chen, Z.; Sunkara, M. K.; Mozetič, M. *Small* 2008, 4, 1610.
17. Wu, J.-M.; Shih, H. C.; Wu, W.-T. *J. Vac. Sc. Technol. B* 2005, 23, 2122.
18. Lau, M.; Dai, L.; Bosnick, K.; Evoy, S. *Nanotechnology* 2009, 20, 025602.
19. Park, J.; Ryu, Y.; Kim, H.; C. Yu *Nanotechnology* 2009, 20, 105608.
20. Hong, Y. C.; Kim, J. H.; Bang, C. U.; Uhm, H. S. *Phys. Plasmas* 2005, 12, 114501.
21. Cheung, K. Y.; Yip, C. T.; Djuriscaroni, A. B.; cacute; Leung, Y. H.; Chan, W. K. *Adv. Funct. Mater.* 2007, 17, 555.
22. Kumar, V.; Kim, J. H.; Pendyala, C.; Chernomordik, B.; Sunkara, M. K. *J. Phys. Chem. C* 2008, 112, 17750.
23. Kim, J. H.; Kumar, V.; Chernomordik, B.; Sunkara, M. K. *Inf. Midem-J. Microelectron. Electron. Compon. Mater.* 2008, 38, 237.
24. Yuan, Z. Y.; Zhang, X. B.; Su, B. L. *Appl. Phys. A: Mater. Sc. Process.* 2004, 78, 1063.
25. Wang, B. L.; Chen, Q.; Hu, J.; Li, H.; Hu, Y. F.; Peng, L. M. *Chemical Physics Letters* 2005, 406, 95.
26. Tsai, C.-C.; Teng, H. *Chem. Mater.* 2005, 18, 367.

27. Wang, B.; Shi, Y.; Xue, D. *J. Sol. St. Chem.* 2007, 180, 1028.
28. Lee, C. T.; Um, M. H.; Kumazawa, H. *J. Am. Ceram. Soc.* 2000, 83, 1098.
29. Bao, N.; Feng, X.; Lu, X.; Yang, Z. *J. Mater. Sc.* 2002, 37, 3035.
30. Du, G. H.; Chen, Q.; Han, P. D.; Yu, Y.; Peng, L. M. *Phys. Rev. B* 2003, 67, 035323.
31. Chandrasekaran, H.; Sumanasekara, G. U.; Sunkara, M. K. *J. Phys. Chem. B* 2006, 110, 18351.
32. Bale, C. *J. Phase Equilib.* 1989, 10, 134.
33. Drelich, J.; Miller, J. D. *J. Colloid Interface Sc.* 1994, 167, 217.
34. Yuchun, O.; Feng, Y.; Jin, C. *J. Appl. Polym. Sc.* 1997, 64, 2317.
35. Sato, Y.; Ejima, T.; Fukasawa, M.; Abe, K. *J. Phys. Chem.* 1990, 94, 1991.
36. Jacob, K. T.; Gupta, S. *Bull. Mater. Sci.* 2009, 32, 611.
37. Li, W. Y.; Xu, L. N.; Chen, J. *Advanced Functional Materials.* 2005, 15, 851.
38. Li, Y.; Tan, B.; Wu, Y. *Nano Letters.* 2007, 8, 265.
39. Kim, D. K.; Muralidharan, P.; Lee, H.-W.; Ruffo, R.; Yang, Y.; Chan, C. K.; Peng, H.; Huggins, R. A.; Cui, Y. Spinel Li. *Nano Letters.* 2008, 8, 3948.
40. Gu, Z.; Li, H.; Zhai, T.; Yang, W.; Xia, Y.; Ma, Y.; Yao, J. *Journal of Solid State Chemistry.* 2007, 180, 98.
41. Brezesinski, T.; Wang, J.; Polleux, J.; Dunn, B.; Tolbert, S. H. *Journal of the American Chemical Society.* 2009, 131, 1802.
42. Wang, L.; Liu, X.; Wang, X.; Yang, X.; Lu, L. *Journal of Materials Science: Materials in Electronics.* 2010, 1.
43. Hu, C.-C.; Hung, C.-Y.; Chang, K.-H.; Yang, Y.-L. *Journal of Power Sources.* 2011, 196, 847.
44. Jitputti, J.; Suzuki, Y.; Yoshikawa, S. *Catalysis Communications.* 2008, 9, 1265.
45. Zhang, Z.; Geng, H.; Zheng, L.; Du, B. *Journal of Alloys and Compounds.* 2005, 392, 317.
46. Shen, Y. F.; Zerger, R. P.; DeGuzman, R. N.; Suib, S. L.; McCurdy, L.; Potter, D. I.; O'Young, C. L. *Science.* 1993, 260, 511.
47. Santato, C.; Odziemkowski, M.; Ulmann, M.; Augustynski, J. *Journal of the American Chemical Society.* 2001, 123, 10639.
48. Wu, R.-J.; Sun, Y.-L.; Lin, C.-C.; Chen, H.-W.; Chavali, M. *Sensors and Actuators B: Chemical.* 2006, 115, 198.
49. Wang, W. Z.; Xu, C. K.; Wang, G. H.; Liu, Y. K.; Zheng, C. L. *Advanced Materials.* 2002, 14, 837.
50. Komarneni, S.; Katsuki, H. *Pure Appl. Chem.* 2002, 74, 1537.
51. Chung, C.-C.; Chung, T.-W.; Yang, T. C. K. *Industrial & Engineering Chemistry Research.* 2008, 47, 2301.
52. Cabanas, A.; Darr, J. A.; Lester, E.; Poliakoff, M. *Chemical Communications.* 2000, 901.
53. Miao, Z.; Xu, D.; Ouyang, J.; Guo, G.; Zhao, X.; Tang, Y. *Nano Lett.* 2002, 2, 717.
54. Limmer, S. J.; Seraji, S.; Wu, Y.; Chou, T. P.; Nguyen, C.; Cao, G. Z. *Adv. Funct. Mater.* 2002, 12, 59.
55. Dai, Y.; Zhang, Y.; Bai, Y. Q.; Wang, Z. L. *Chemical Physics Letters.* 2003, 375, 96.
56. Chen, Y.; Cui, X.; Zhang, K.; Pan, D.; Zhang, S.; Wang, B.; Hou, J. G. *Chemical Physics Letters.* 2003, 369, 16.
57. Zhang, J.; Jiang, F. *Chemical Physics.* 2003, 289, 243.
58. Wu, X. C.; Hong, J. M.; Han, Z. J.; Tao, Y. R. *Chemical Physics Letters.* 2003, 373, 28.
59. Thangala, J.; Vaddiraju, S.; Bogale, R.; Thurman, R.; Powers, T.; Deb, B.; Mahendra K. Sunkara. *Small.* 2007, 3, 890.
60. Zhou, J.; Xu, N. S.; Deng, S. Z.; Chen, J.; She, J. C. *Chemical Physics Letters.* 2003, 382, 443.
61. Kumar, V.; Kim, J. H.; Jasinski, J. B.; Clark, E. L.; Sunkara, M. K. *Submitted Crystal Growth & Design* 2011.
62. Gao, T.; Fjellvag, H.; Norby, P. *Analytica Chimica Acta.* 2009, 648, 235.
63. Liu, Y.; Liu, Z.; Wang, G. *Applied Physics A: Materials Science & Processing.* 2003, 76, 1117.
64. Yu, T.; Zhu, Y. W.; Xu, X. J.; Shen, Z. X.; Chen, P.; Lim, C. T.; Thong, J. T. L.; Sow, C. H. *Advanced Materials.* 2005, 17, 1595.
65. He, L. et al. *Nanotechnology.* 2008, 19, 155606.
66. Hadjiev, V. G. et al. *Journal of Physics C: Solid State Physics.* 1988, 21, L199.
67. Ha, J.-H.; Muralidharan, P.; Kim, D. K. *Journal of Alloys and Compounds.* 2009, 475, 446.
68. Daniel, M. F.; Desbat, B.; Lassegues, J. C.; Gerand, B.; Figlarz, M. *Journal of Solid State Chemistry.* 1987, 67, 235.
69. Huang, K. et al. *Journal of Physics D: Applied Physics.* 2008, 41, 155417.
70. Senthil, K.; Yong, K. *Nanotechnology.* 2007, 18, 395604.
71. Baek, Y.; Yong, K. *The Journal of Physical Chemistry C.* 2007, 111, 1213.
72. Chang, Y. Q.; Xu, X. Y.; Luo, X. H.; Chen, C. P.; Yu, D. P. *Journal of Crystal Growth.* 2004, 264, 232.
73. Huang, K.; Zhang, Q.; Yang, F.; He, D. *Nano Research.* 2010, 3, 281.
74. Li, Y.; Tan, B.; Wu, Y. *Journal of the American Chemical Society.* 2006, 128, 14258.
75. Fang, Z.; Tang, K.; Gao, L.; Wang, D.; Zeng, S.; Liu, Q. *Materials Research Bulletin.* 2007, 42, 1761.
76. Salmaoui, S.; Sediri, F.; Gharbi, N. *Polyhedron.* 2010, 29, 1771.

It will be understood that various details of the presently disclosed subject matter can be changed without departing from the scope of the subject matter disclosed herein. Furthermore, the foregoing description is for the purpose of illustration only, and not for the purpose of limitation.

What is claimed is:

1. A method for synthesizing a transition metal oxide nanowire consisting essentially of the steps:
    a) providing a transition metal oxide, selected from the group consisting of titanium oxide, tungsten oxide, cobalt oxide, and manganese oxide;
    b) providing an alkali metal compound, wherein said alkali metal compound is in the solid or molten physical state;
    c) combining an amount of said transition metal oxide with an amount of said alkali metal compound to produce a mixture;
    d) activating a plasma discharge reactor to create a plasma discharge; and
    e) exposing the mixture to the plasma discharge for a first predetermined time period of from about 2 minutes to about 30 minutes such that the transition metal oxide nanowire is formed.

2. The method of claim 1, wherein the plasma discharge has a power of about 200 W to about 5000 W.

3. The method of claim 1, wherein the plasma discharge extends vertically downwards, and wherein the step of exposing the mixture to the plasma discharge for the first predetermined time period includes feeding the mixture into the plasma discharge reactor.

4. The method of claim 1, wherein the plasma discharge extends vertically upwards, and wherein the step of exposing the mixture to the plasma discharge for the first predetermined time period includes placing the mixture on a substrate and exposing the substrate to the plasma discharge.

5. The method of claim 1, wherein the plasma discharge extends vertically downwards, and wherein the step of exposing the mixture to the plasma discharge for the first predetermined time period includes placing the mixture on a substrate and exposing the substrate to the plasma discharge.

6. The method of claim 1, wherein the alkali metal compound is selected from the group consisting of potassium, lithium, sodium, potassium chloride, lithium chloride, sodium chloride, potassium hydroxide, lithium hydroxide, and sodium hydroxide.

7. The method of claim 6, wherein the alkali metal compound comprises potassium chloride.

8. The method of claim 1, wherein the transition metal oxide is titanium oxide.

9. The method of claim 1, wherein the transition metal oxide is provided in the form of a foil.

10. A method for synthesizing a transition metal oxide nanowire consisting essentially of the steps:
   a) providing a transition metal oxide, selected from the group consisting of titanium oxide, tungsten oxide, cobalt oxide, and manganese oxide;
   b) providing an alkali metal compound, wherein said alkali metal compound is in the solid or molten physical state;
   c) combining an amount of said transition metal oxide with an amount of said alkali metal compound to produce a mixture;
   d) activating a plasma discharge reactor to create a plasma discharge;
   e) exposing the mixture to the plasma discharge for a first predetermined time period of from about 2 minutes to about 30 minutes such that the transition metal oxide nanowire is formed;
   f) contacting the transition metal oxide nanowires with an aqueous acid solution such that an alkali metal ion is exchanged for a hydrogen ion on each of the transition metal oxide nanowires; and
   g) exposing the transition metal oxide nanowires to the plasma discharge for a second predetermined time period to thermally anneal the transition metal oxide nanowires.

11. The method of claim 10, wherein the plasma discharge has a power of about 500 W to about 3000 W.

12. The method of claim 10, wherein the plasma discharge extends vertically downwards, and wherein the step of exposing the mixture to the plasma discharge for the first predetermined time period includes feeding the mixture into the plasma discharge reactor.

13. The method of claim 10, wherein the plasma discharge extends vertically upwards, and wherein the step of exposing the mixture to the plasma discharge for the first predetermined time period includes placing the mixture on a substrate and exposing the substrate to the plasma discharge.

14. The method of claim 10, wherein the plasma discharge extends vertically downwards, and wherein the step of exposing the mixture to the plasma discharge for the first predetermined time period includes placing the mixture on a substrate and exposing the substrate to the plasma discharge.

15. The method of claim 10, wherein the alkali metal compound is selected from the group consisting of potassium, lithium, sodium, potassium chloride, lithium chloride, sodium chloride, potassium hydroxide, lithium hydroxide, and sodium hydroxide.

* * * * *